United States Patent
Ohkawara et al.

(10) Patent No.: US 8,314,656 B2
(45) Date of Patent: Nov. 20, 2012

(54) POWER SERIES DIGITAL PREDISTORTER AND DISTORTION COMPENSATION CONTROL METHOD THEREOF

(75) Inventors: Junya Ohkawara, Yokohama (JP); Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 0 days.

(21) Appl. No.: 13/033,279

(22) Filed: Feb. 23, 2011

(65) Prior Publication Data

US 2011/0210789 A1  Sep. 1, 2011

(30) Foreign Application Priority Data

Feb. 26, 2010  (JP) ................ 2010-042293

(51) Int. Cl.
*H03F 1/32* (2006.01)
(52) U.S. Cl. ...................... 330/149; 375/297
(58) Field of Classification Search .............. 330/149; 455/114.3; 375/296–297
See application file for complete search history.

(56) References Cited

U.S. PATENT DOCUMENTS 7,053,709 B1 *  5/2006  Darvish-Zadeh et al. .... 330/149

FOREIGN PATENT DOCUMENTS

JP  2006-352852  12/2006

OTHER PUBLICATIONS

Shinji Mizuta, et al., "A New Adjustment Method for the Frequency-Dependent IMD Compensator of the Digital Predistortion Linearizer", IEEE Radio and Wireless Symposium 2006, Jan. 2006, pp. 255-258.

Junya Ohkawara, et al., "Fast Calculation Scheme for Frequency Characteristic Compensator of Digital Predistortion Linearizer", Vehicular Technology Conference 2009, IEEE 69th, Apr. 2009, 5 pages.

Korean Office Action issued Aug. 24, 2012 for corresponding Korean Patent Application No. 10-2011-0015601 (with an English translation).

* cited by examiner

*Primary Examiner* — Hieu Nguyen
(74) *Attorney, Agent, or Firm* — Oblon, Spivak, McClelland, Maier & Neustadt, L.L.P.

(57) ABSTRACT

Coefficients $W_0$, $W_1$ and $W_2$ to be used in finding a new quadratic function $f_2(W)$ indicating dependence of a distortion component on an coefficient by the least square method are obtained as values that satisfy a relational expression $f_1(W_0)=f_1(W_2)=f_1(W_1)+P$ (where P is a true value) on the basis of a quadratic function $f_1(W)$ indicating unupdated distortion component coefficient dependence.

8 Claims, 27 Drawing Sheets

FIG.18A

| RANGE OF $a_2$ | $\gamma_{set,1}$ | $\gamma_{set,3}$ |
|---|---|---|
| $0<a_2\leq1$ | 1.1 | 1.1 |
| $1<a_2\leq2$ | 0.6 | 0.6 |
| $2<a_2\leq3$ | 0.5 | 0.5 |
| $3<a_2$ | 0.4 | 0.4 |

FIG.18B

| RANGE OF $b_2$ | $\mu_{set,1}$ | $\mu_{set,3}$ |
|---|---|---|
| $0<b_2\leq1$ | 1.1 | 1.1 |
| $1<b_2\leq2$ | 0.6 | 0.6 |
| $2<b_2\leq3$ | 0.5 | 0.5 |
| $3<b_2$ | 0.4 | 0.4 |

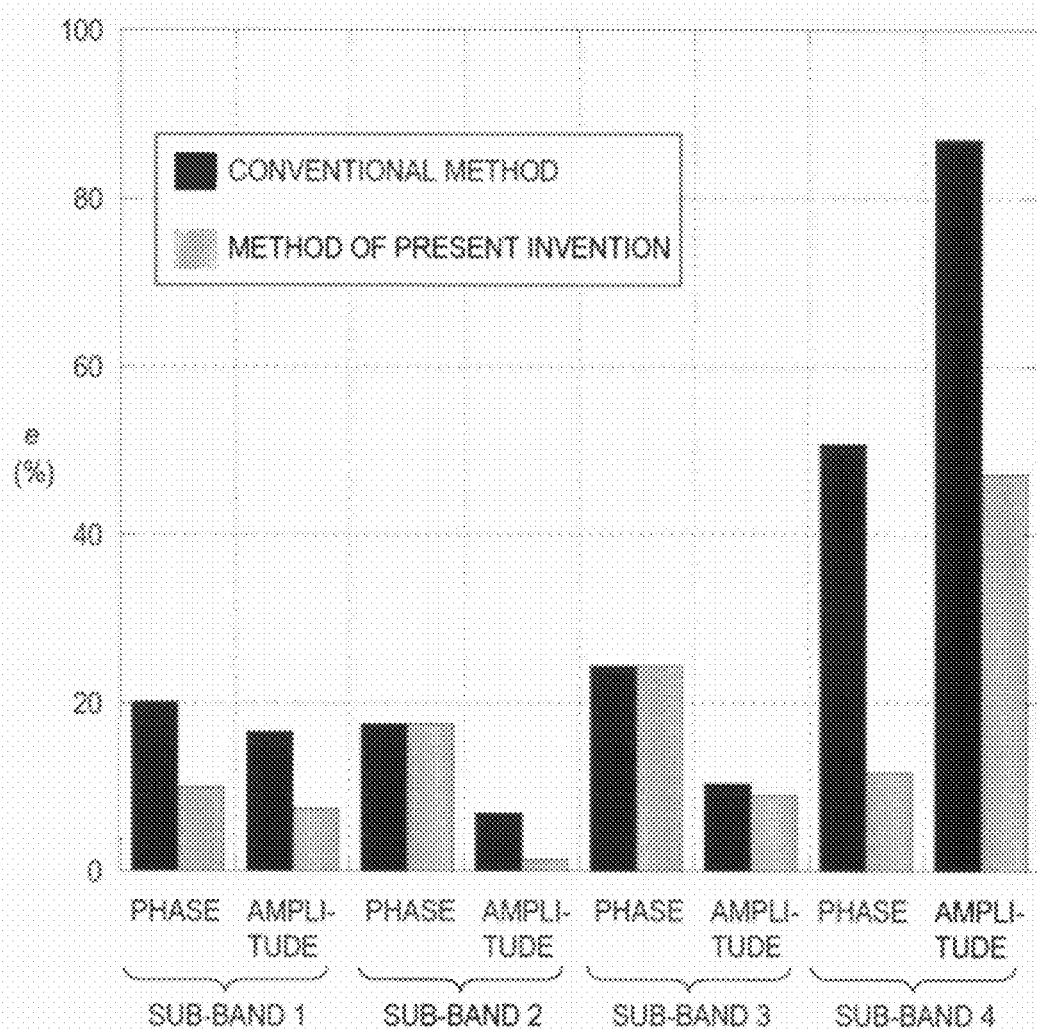

POWER SERIES DIGITAL PREDISTORTER AND DISTORTION COMPENSATION CONTROL METHOD THEREOF

TECHNICAL FIELD

The present invention relates to a power series digital predistorter and a method for controlling distortion compensation for the power series digital predistorter.

BACKGROUND ART

One way to compensate for non-linear distortion components (hereinafter referred to as distortion components) produced in a power amplifier is predistortion, in which a predistorter generates distortion compensation components that cancel distortion components produced in the power amplifier. The distortion compensation components are added to a signal input into the power amplifier in advance to compensate for the distortion components.

It is known that power amplifiers in general produce frequency-dependent, complex distortion components when they are operating near their saturation regions where they provide high efficiency. Some power series digital predistorters that compensate for frequency-dependent distortion components include a frequency characteristic compensator (For example, S. Mizuta, Y. Suzuki, S. Narahashi, and Y. Yamao, "A New Adjustment Method for the Frequency-Dependent IMD Compensator of the Digital Predistortion Linearizer," IEEE Radio and Wireless Symposium 2006, January 2006, pp. 255-258; and J. Ohkawara, Y. Suzuki, S. Narahashi, "Fast Calculation Scheme for Frequency Characteristic Compensator of Digital Predistortion Linearizer," VTC-2009 Spring, April 2009).

FIG. 1 illustrates an example of a conventional-art power series digital predistorter 500 combined with an amplifier 10 and a feedback signal generator 20, which are peripheral devices. I-phase and Q-phase digital signals are input into the power series digital predistorter 500.

The power series digital predistorter 500 includes a linear transmission path 110, a third-order distortion generating path 520, a divider 130, a combiner 140, a digital-to-analog (DA) converter 150, an analog-to-digital (AD) converter 160, a monitor 170, and a controller 580. The linear transmission path 110 includes a delay circuit. The third-order distortion generating path 520 includes a third-order distortion generator 521, a third-order vector adjuster 522, and a third-order frequency characteristic compensator 523. The divider 130 distributes I-phase and Q-phase digital signals input into the power series digital predistorter 500 to the linear transmission path 110 and the third-order distortion generating path 520. The combiner 140 combines a signal output from the linear transmission path 110 with a signal output from the third-order distortion generating path 520. The DA converter 150 converts a digital signal output from the combiner 140 to an analog signal. The AD converter 160 converts I- and Q-phase analog signals output from the feedback signal generator 20, which extracts a part of a signal output from the amplifier 10 as a feedback signal, to I- and Q-phase digital signals, respectively. The monitor 170 measures the power of signals input into the power series digital predistorter 500 and amplified by a power amplifier 13 from signals output from the AD converter 160 and also measures the power of distortion components in each of any predetermined frequency bands that were produced in the power amplifier 13 from signals output from the AD converter 160. Based on the results of the measurement by the monitor 170, the controller 580 adjusts a third-order vector adjuster coefficient including a phase value and an amplitude value to be provided to the third-order vector adjuster 522 and adjusts a plurality of third-order frequency characteristic compensator coefficients each including a plurality of phase values and a plurality of amplitude values to be provided to the third-order frequency characteristic compensator 523.

The amplifier 10 includes a quadrature modulator 11, an up-converter 12 and the power amplifier 13. The quadrature modulator 11 quadrature-modulates I- and Q-phase analog signals. The up-converter 12 converts the frequency of a signal output from the quadrature modulator 11 to a predetermined frequency. The power amplifier 13 amplifies the power of a signal output from the up-converter 12. The amplified signal is provided from the output end of the power amplifier 13 to an antenna through a duplexer, not shown, for example. The feedback signal generator 20 includes a directional coupler 21, a down-converter 22, and a quadrature demodulator 23. The directional coupler 21 extracts a part of a signal output from the amplifier 10. The down-converter 22 converts the frequency of the signal extracted by the directional coupler 21 to a predetermined frequency. The quadrature demodulator 23 demodulates a signal output from the down-converter 22 to I- and Q-phase analog signals.

The third-order distortion generator 521 cubes signals output from the divider 130 to generate third-order distortion components. The third-order vector adjuster 522 multiplies the third-order distortion components generated by the third-order distortion generator 521 by third-order vector adjuster coefficients provided from the controller 580 to adjust the phase and amplitude of the third-order distortion components. The third-order frequency characteristic compensator 523 multiplies third-order distortion component upper sub-band and third-order distortion component lower sub-bands, in total M sub-bands, as illustrated in FIG. 2, by different third-order frequency characteristic compensator coefficients, respectively. The transmission signal band in FIG. 2 includes input signals of the power series digital predistorter 500 that passed through the amplifier 10. FIG. 3 illustrates an exemplary configuration of the third-order frequency characteristic compensator 523. The third-order frequency characteristic compensator 523 includes a serial-to-parallel conversion part 523$a$, a J-point Fast Fourier Transformation (FFT) part 523$b$, J (J$\geq$M) complex multiplication parts 523$c_j$ (j is an integer from 1 to J), a J-point Inverse Fast Fourier Transformation (IFFT) part 523$d$, and a parallel-to-serial conversion part 523$e$. The serial-to-parallel conversion part 523$a$ converts a serial signal output from the third-order vector adjuster 522 to parallel signals. The J-point FFT part 523$b$ transforms each of the signals output from the serial-to-parallel conversion part 523$a$ from time domain to frequency domain. A signal component outputted from the J-point FFT part 523$b$ that is in sub-band 1 out of the M sub-bands is input into the complex multiplication part 523$c_j$ in which the third-order frequency characteristic compensator coefficient for sub-band 1 provided from the controller 580 is set. The complex multiplication part 523$c_j$ multiplies the input signal by the third-order frequency characteristic compensator coefficient to adjust the phase and amplitude of the signal and outputs the adjusted signal. The same processing is applied to sub-bands 2 to M. Of the signals output from the J-point FFT part 523$b$, signal components that fall in none of the M sub-bands are input into the J-point IFFT part 523$d$ without being multiplied by a third-order frequency characteristic compensator coefficient in the complex multiplication part 523$c_j$. The J-point IFFT part 523$d$ transforms each of the signals output from the complex multiplication parts 523$c_j$ from frequency domain to time domain. The parallel-to-serial conversion part 523e converts parallel signals output from the J-point IFFT part 523d to a serial signal.

The controller 580 adjusts the third-order vector adjuster coefficients to be provided to the third-order vector adjuster 522 and the third-order frequency characteristic compensator coefficients to be provided to the third-order frequency characteristic compensator 523 so as to minimize distortion components produced in the power amplifier 13. The third-order frequency characteristic compensator coefficients are calculated as follows. FIG. 4 illustrates an exemplary process flow for calculating a third-order frequency characteristic compensator coefficient (phase value) that minimizes a distortion component in a sub-band m. While FIG. 4 illustrates a process flow for calculating a phase value, an amplitude value can be calculated by a process similar to the process in FIG. 4. Here, the phase value to be provided to the complex multiplication part $523c_j$ for the sub-band m is a variable $X_m$, a distortion component is measured T1 times with different phase values, and a phase value $X_{m.t1}$ is provided to the complex multiplication part $523c_j$ for the sub-band m for measuring the distortion component (where t1=0, 1, ..., T1−1). T1 different values of $X_{m.t1}$ are determined beforehand, where T1 is greater than or equal to 3. The controller 580 sets the phase value $X_{m.t1}$ of the sub-band m in the complex multiplication part 523c, for the sub-band m ("SET PHASE VALUE" in FIG. 4). The monitor 170 measures distortion component power $D_{m.t1}$ of the sub-band m at the phase value $X_{m.t1}$ ("MEASURE DISTORTION COMPONENT" in FIG. 4). The phase value $X_{m.t1}$ and the distortion component power $D_{m.t1}$ are recorded ("RECORD MEASURED VALUE" in FIG. 4). The sequence from SET PHASE VALUE to RECORD MEASURED VALUES is repeated T1 times. T1 sets of $X_{m.t1}$ and $D_{m.t1}$ obtained through the repetitive process are used to find coefficients ($a_{2.m}$, $a_{1.m}$, $a_{0.m}$) of a quadratic function ($D_m = a_{2.m} X_m^2 + a_{1.m} X_m + a_{0.m}$) representing dependence of $D_m$ on the phase values of frequency characteristic compensator coefficients by the method of least squares, where $D_m$ is a variable of the distortion component in the sub-band m ("FIND COEFFICIENTS ($a_{2.m}$, $a_{1.m}$, $a_{0.m}$)" in FIG. 4). Then, a phase value $X_{m.cal}$ ($=-a_{1.m}/2a_{2.m}$) that minimizes the found quadratic function is calculated ("CALCULATE MINIMUM VALUE ($X_{m.cal} = -a_{1.m}/2a_{2.m}$)" in FIG. 4) and the calculated phase value is set in the complex multiplication part 523c for the sub-band m as the phase value of the third-order frequency characteristic compensator coefficient for the sub-band m ("SET CALCULATED VALUE" in FIG. 4). Then the process proceeds to amplitude value calculation. The amplitude value is calculated in a way similar to the way that the phase value was calculated and the calculated amplitude value is set in the complex multiplication part 523c. Then the process proceeds to calculation of the phase and amplitude values in the next sub-band m+1.

The method for calculating third-order frequency characteristic compensator coefficients that minimize distortion components described above can also be used to calculate third-order vector adjuster coefficients that minimize distortion components.

SUMMARY OF THE INVENTION

As distortion components produced in the power amplifier change due to age deterioration of the power amplifier and temperature change, the Nth-order vector adjuster coefficients and Nth-order frequency characteristic compensator coefficients (N is an odd number greater than or equal to 3) of the power series digital predistorter that minimize distortion components also change. The controller of the power series digital predistorter needs to update the Nth-order vector adjuster coefficients and the Nth-order frequency characteristic compensator coefficients according to change of the distortion components in order to keep the distortion components minimum (or less than or equal to a given specified value).

If LMS (Least Mean Square) algorithms, which are a commonly used updating method, are used to update an Nth-order vector adjuster coefficients and Nth-order frequency characteristic compensator coefficients, a new Nth-order vector adjuster coefficient and new Nth-order frequency characteristic compensator coefficients that are close to the current Nth-order vector adjuster coefficient and Nth-order frequency characteristic compensator coefficients set in the Nth-order vector adjuster and the Nth-order frequency characteristic compensator, respectively, are provided to the Nth-order vector adjuster and the Nth-order frequency characteristic compensator to find an Nth-order vector adjuster coefficient and Nth-order frequency characteristic compensator coefficients that minimize the level of distortion components. One advantage of using the Nth-order vector adjuster coefficient and Nth-order frequency characteristic compensator coefficients that are close to the current Nth-order vector adjuster coefficient and Nth-order frequency characteristic compensator coefficients is that the Nth-order vector adjuster coefficient and the Nth-order frequency characteristic compensator coefficients can be updated so that the levels of distortion components fall within the range of predetermined specified values as completely as possible.

Referring to FIG. 5, a conventional updating method will be described briefly with respect to an example of updating an Nth-order vector adjuster coefficient. Assumption here is that previously found dependence of an Nth-order vector adjuster coefficient for a distortion component before update is expressed by a quadratic function $f_1(W)$ illustrated in FIG. 5, where W is an Nth-order vector adjuster coefficient. Three coefficients, $W_0$, $W_1$ and $W_2$, with which the Nth-order vector adjuster coefficient that minimizes the distortion component are derived. Here, $W_1$ is the Nth-order vector adjuster coefficient that minimizes $f_1(W)$, $W_0$ is $W_1 - \Delta W$, and $W_2$ is $W_1 + \Delta W$ ($\Delta W$ is a predetermined phase or amplitude distance). The derived Nth-order vector adjuster coefficients $W_0$, $W_1$ and $W_2$ are sequentially set in the Nth-order vector adjuster and the level of the distortion component is measured with each of the Nth-order vector adjuster coefficients. Then the three sets of Nth-order vector adjuster coefficients and the distortion component levels thus obtained are used to find a quadratic function $f_2(W)$ by the least square method. The Nth-order vector adjuster coefficient $W_{new}$ that minimizes $f_2(W)$ is calculated and the Nth-order vector adjuster coefficient set in the Nth-order vector adjuster is updated with $W_{new}$. While an Nth-order vector adjuster coefficient updating method has been described here, Nth-order frequency characteristic compensator coefficients can be updated in a way similar to the method.

FIG. 6 illustrates exemplary amplitude values of a third-order frequency characteristic compensator coefficient calculated by the conventional updating method. When three amplitude values $Y_{m.0}$, $Y_{m.1}$, and $Y_{m.2}$ with which the level of a distortion component is measured are close to one another, the quadratic function ("APPROXIMATED COEFFICIENT DEPENDENCE" in FIG. 6) found according to the conventional method does not agree with the quadratic function representing actual coefficient dependence ("ACTUAL COEFFICIENT DEPENDENCE" in FIG. 6). There is a difference between the calculated amplitude value $Y_{m.cal}$ and the amplitude value $Y_{m,min}$ that actually minimizes the distortion component level as illustrated in FIG. 6. If this happens, calculations of the phase and amplitude values would be repeated until the level of the distortion component decreases to a desired level or lower, requiring a longer processing time.

With the aim of solving the problem, the difference between a calculated coefficient $W_{cal}$ that possibly minimizes the level of a distortion component and a coefficient $W_{min}$ that actually minimizes the level of the distortion component was analyzed. For the analysis, the difference between $W_{min}$ and $W_{cal}$ was defined by an evaluation function, $e=100*|W_{min}-W_{cal}|/W_{min}$. The quadratic function yielding $W_{min}$, $f_2(W_i)=27.8 W_i^2-42.3W_i+22.7$, obtained by an experiment that was conducted by using 64-subcarrier OFDM signals (with a bandwidth of 3.84 MHz) and a 2-GHz band 1 W amplifier was used, where $W_i$ is a variable. Three coefficients with which the level of the distortion component was measured were defined as $W_0$, $W_1$ and $W_2$, where $W_1$ is the median, $W_0$ is $W_1-\Delta W$, and $W_2$ is $W_1+\Delta W$. Deviations, $\delta_0$ and $\delta_2$, of the distortion component were given to $f_2(W_0)$ and $f_2(W_2)$, respectively. Here, $W_{cal}$ is the coefficient that minimizes the quadratic function found by the least square method based on the values of $f_2(W_0)+\delta_0, f_2(W_1)$ and $f_2(W_2)+\delta_2$. FIG. 7 illustrates the results of calculation of evaluation function e, where $W_1=0.96$. The result in (a) was obtained with $\Delta W$ set to 0.1; the result in (b) was obtained with $\Delta W$ set to 0.7. The horizontal axis represents the value of $f_2(W_0)+\delta_0$ normalized with $f_2(W_0)$ and the vertical axis represents the value of $f_2(W_2)+\delta_2$ normalized with $f_2(W_2)$. The blank region represents the region where $W_{cal}$ cannot be obtained. It can be seen from FIG. 7 that normalized $f_2(W_0)+\delta_0$ and $f_2(W_2)+\delta_2$ in the case of $\Delta W=0.1$ have narrower regions in which the evaluation function e is below 10% than those in the case of $\Delta W=0.7$. This fact shows that $\Delta W$ needs to be large in order to reduce e, that is, the difference between the distortion component levels at points at which the distortion component is measured needs to be increased. However, it is difficult to set an appropriate $\Delta W$ because $\Delta W$ depends on the shape of the quadrature function.

In light of the results of the analysis of the updating method described above, an object of the present invention is to provide a power series digital predistorter and a distortion compensation control method for the power series digital predistorter that are capable of more appropriately setting values of three coefficients for measuring a distortion component than conventional methods when Nth-order vector adjuster and Nth-order frequency characteristic compensator coefficients are updated and are capable of calculating updated values of Nth-order vector adjuster and Nth-order frequency characteristic compensator coefficients that minimize or decrease a distortion component to a lower levels in a single step of calculation than a level that can be achieved by conventional methods.

A power series digital predistorter according to the present invention includes a linear transmission path, a distortion generating path, a combiner, a monitor and a controller. The linear transmission path delays and transmits a signal input into the power series digital predistorter. The distortion generating path includes an Nth-order distortion generator and an Nth-order vector adjuster. The Nth-order distortion generator generates an Nth-order distortion component of the input signal. The Nth-order vector adjuster adjusts the phase and amplitude of the Nth-order distortion component and outputs a distortion compensation component. The combiner combines the input signal output from the linear transmission path with the distortion compensation component output from the distortion generation path. The monitor measures a distortion component in each of predetermined frequency bands contained in an output from a power amplifier, which amplifies the power of the output from the combiner. The controller calculates amounts of adjustment for the phase and amplitude of an Nth-order distortion component for generating a distortion compensation component that cancels the distortion component contained in the output from the power amplifier measured by the monitor and sets the amounts of adjustment in the Nth-order vector adjuster. Specifically, the controller includes a vector adjuster control part and a vector adjuster coefficient deriving part.

The vector adjuster control part sets a plurality of phase values and a plurality of amplitude values that are used for measuring a distortion component in the Nth-order vector adjuster and finds dependence of a distortion component contained in the output of the power amplifier on a phase value set in the Nth-order vector adjuster and an amplitude value set in the Nth-order vector adjuster from a plurality of distortion components each measured by the monitor under each of the set the plurality of phase values and from a plurality of distortion components each measured by the monitor under the set the plurality of amplitude values. The vector adjuster control part then calculates phase and amplitude values that cancel the distortion component contained in the output of the power amplifier from the found dependences and sets the phase and amplitude values in the Nth-order vector adjuster.

When the vector adjuster control part finds dependences of the distortion component contained in the output of the power amplifier on phase and amplitude values set in the Nth-order vector adjuster, the vector adjuster coefficient deriving part derives a plurality of phase values and a plurality of amplitude values for measuring the distortion component from previously found dependence of the distortion component contained in the output of the power amplifier on the phase value set in the Nth-order vector adjuster and the amplitude value set in the Nth-order vector adjuster, and provides the derived phase and amplitude values to the vector adjuster control part.

EFFECTS OF THE INVENTION

The power series digital predistorter and the distortion compensation control method of the predistorter according to the present invention are capable of more appropriately setting values of three coefficients for measuring a distortion component than conventional methods when Nth-order vector adjuster coefficients and Nth-order frequency characteristic compensator coefficients are updated and are therefore capable of calculating Nth-order vector adjuster coefficients and Nth-order frequency characteristic compensator coefficients that minimize or decrease a distortion component to a lower level in a single step of calculation than a level that can be achieved by conventional methods. Consequently, the number of repetitive calculations required for reducing a distortion component to a predetermined level can be reduced and therefore the time required for updating can be reduced.

Figure 5:
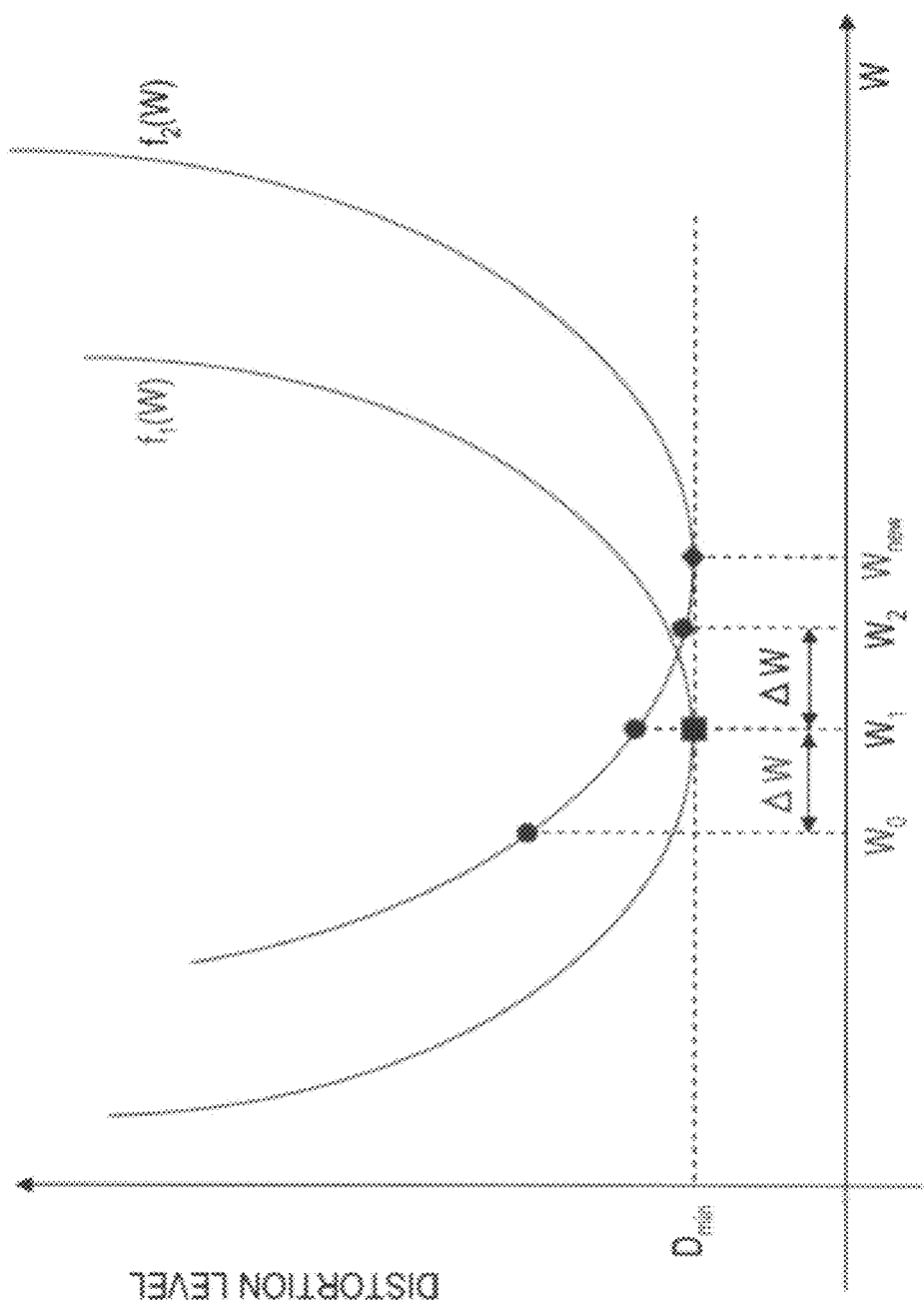
Figure 6:
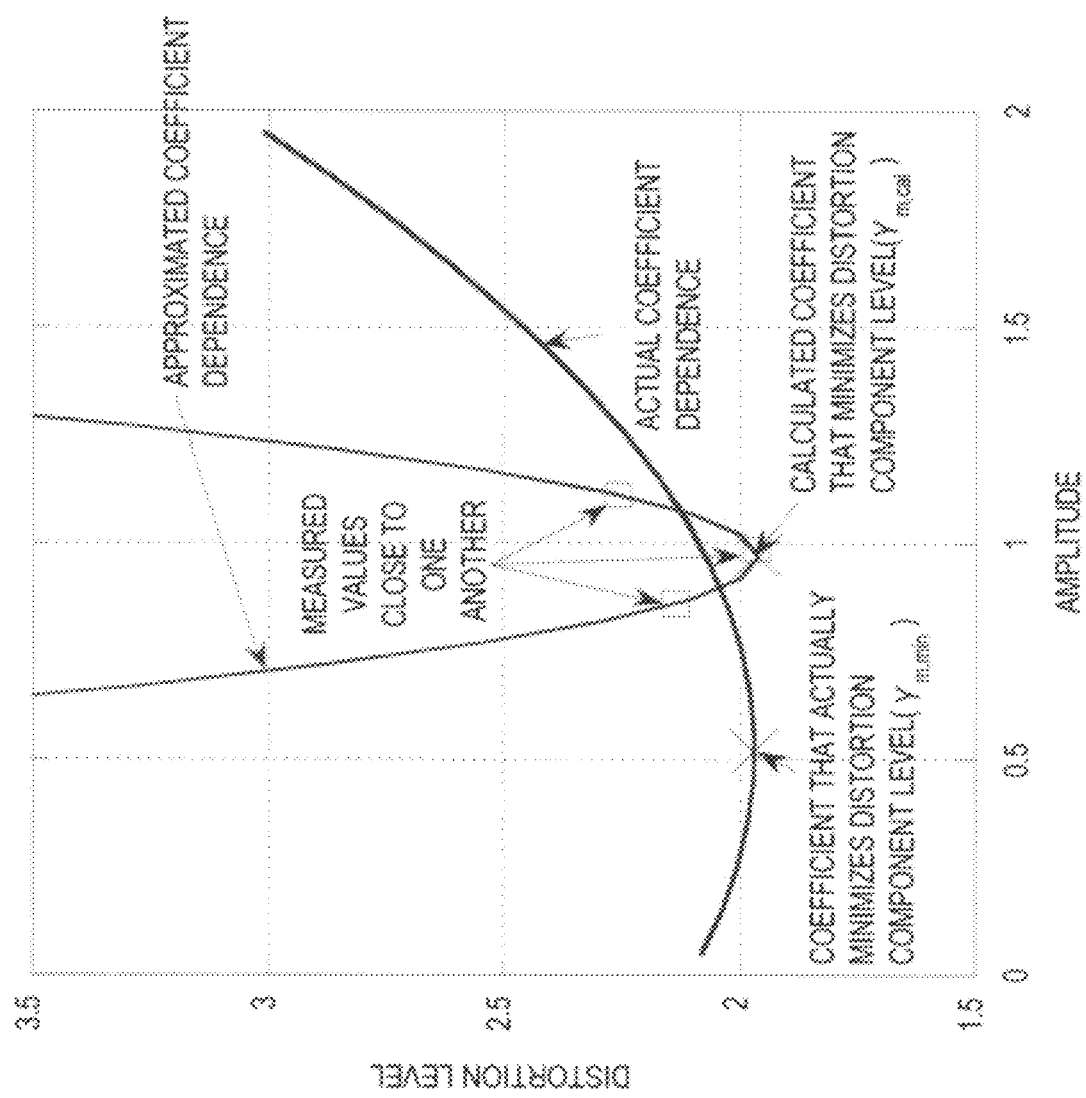
Figure 7:
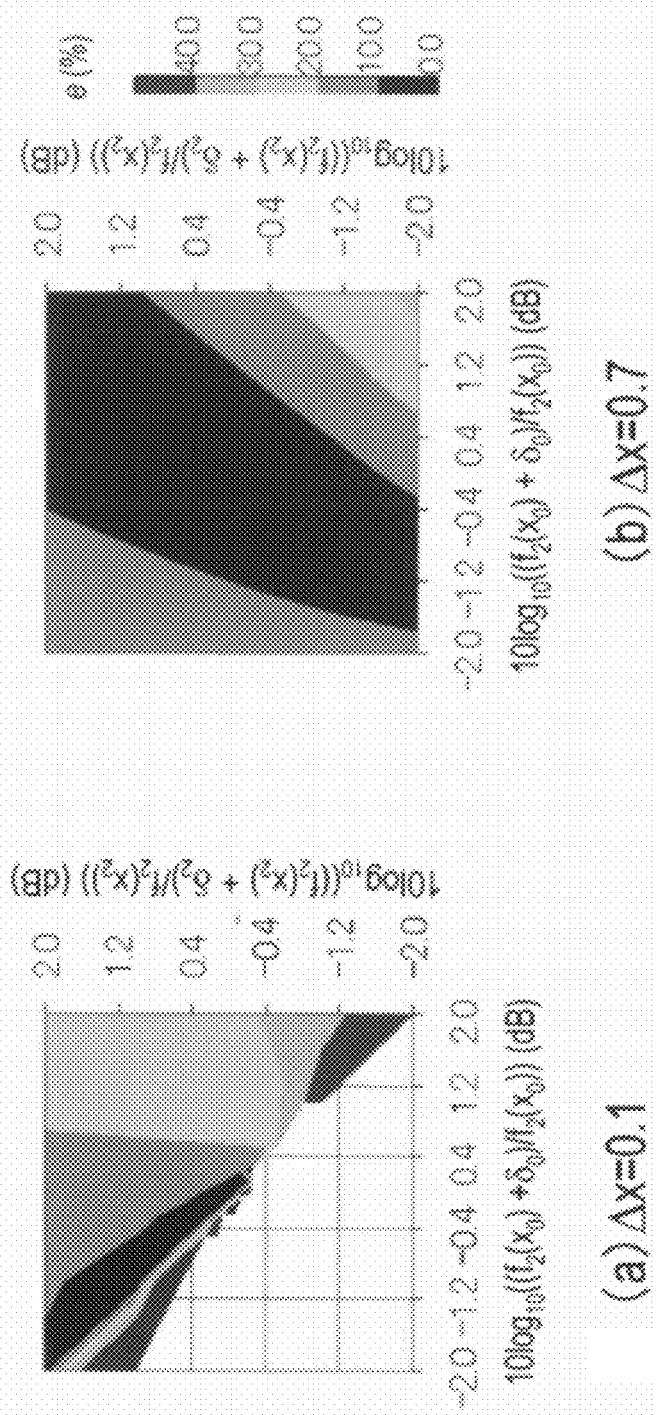
Figure 8:
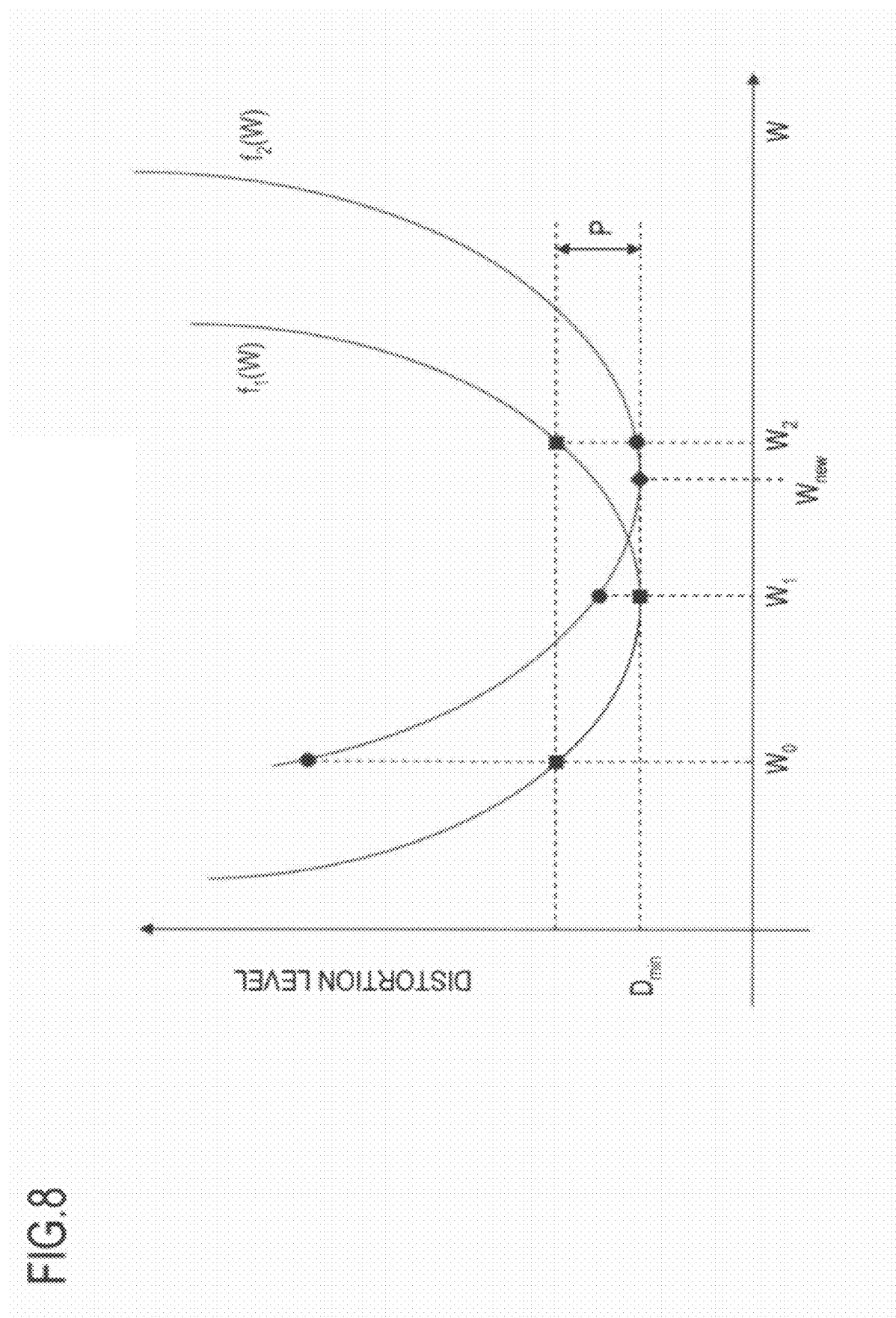
Figure 9:
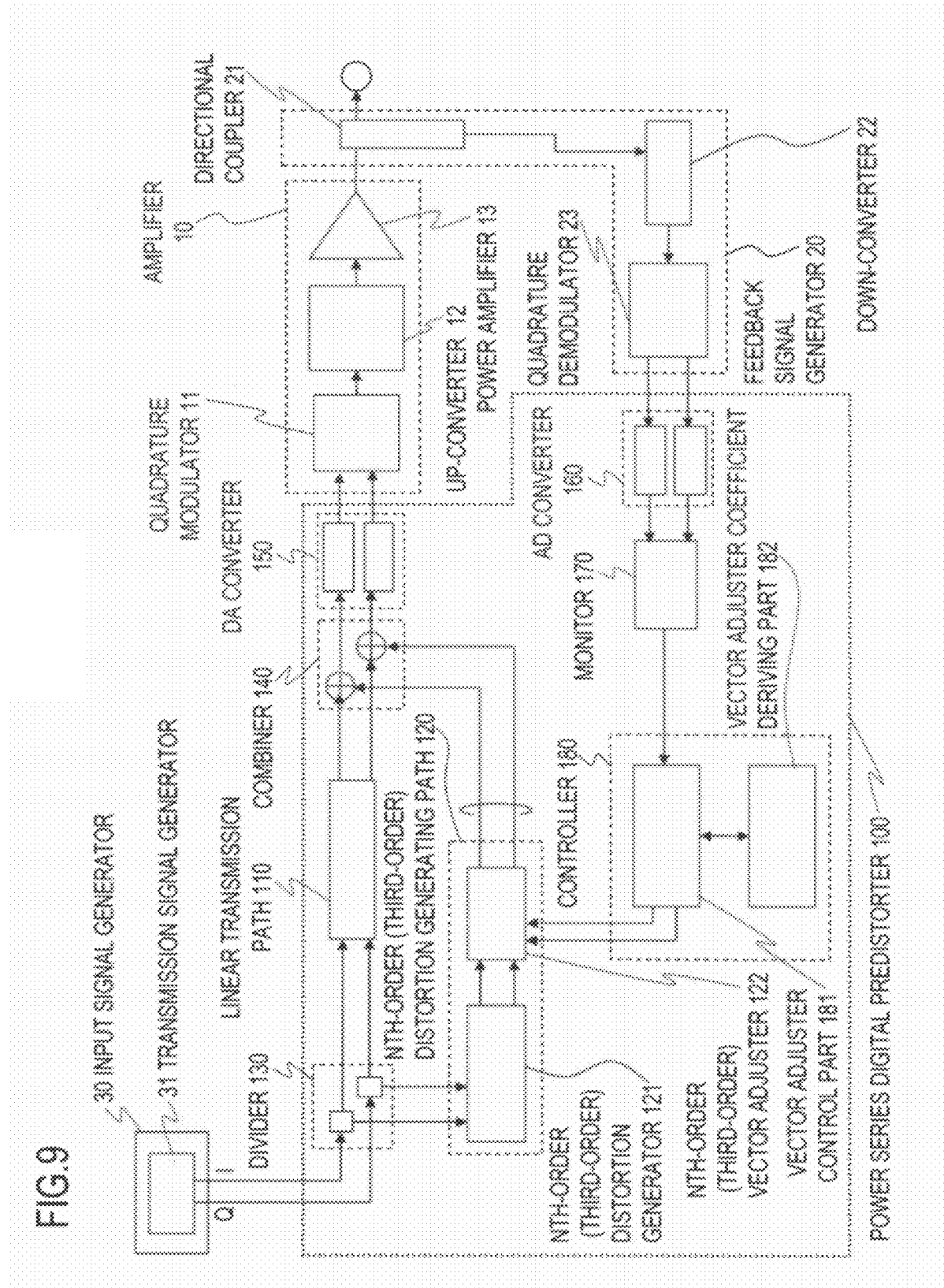
Figure 10:
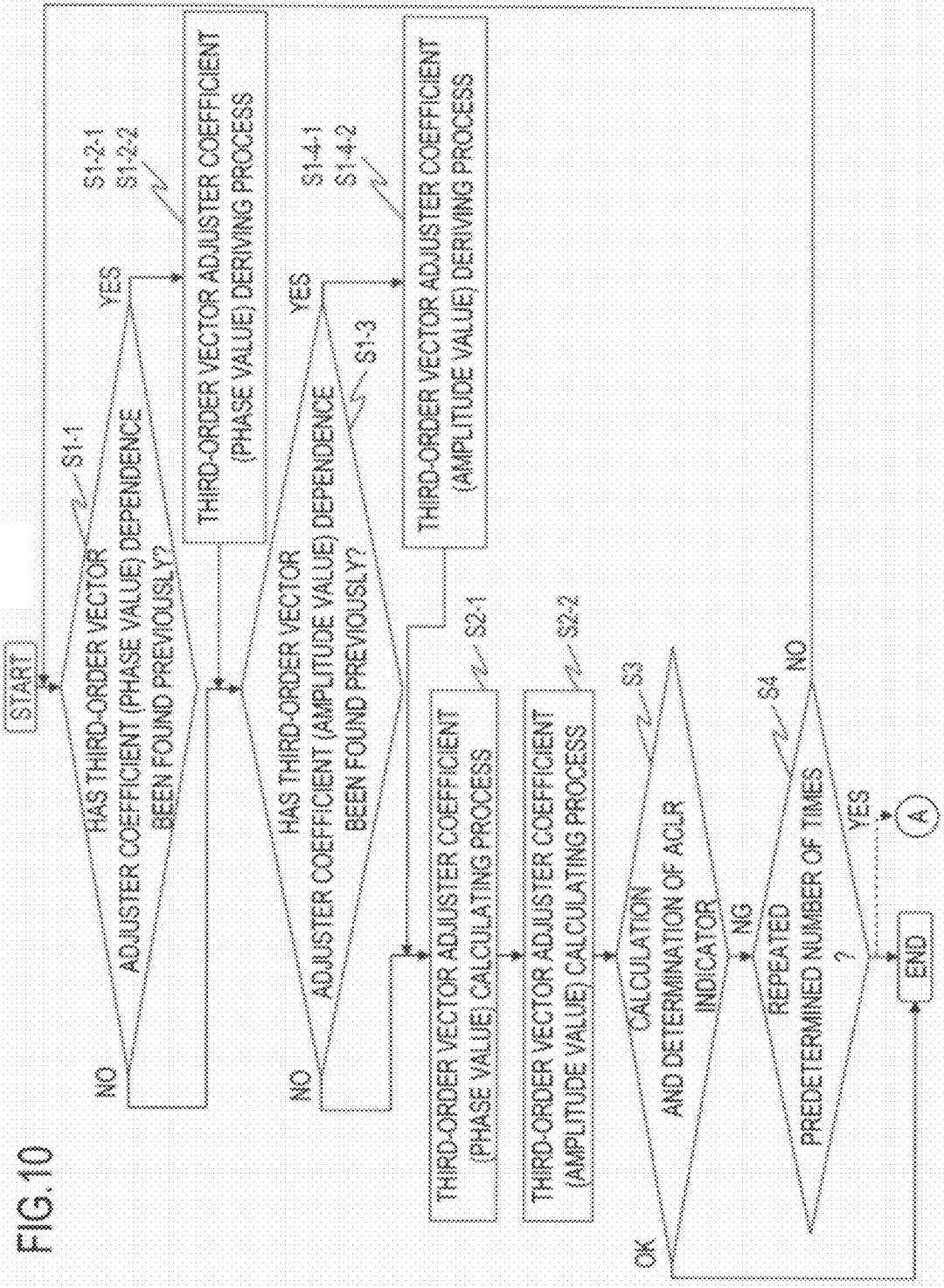
Figure 11:
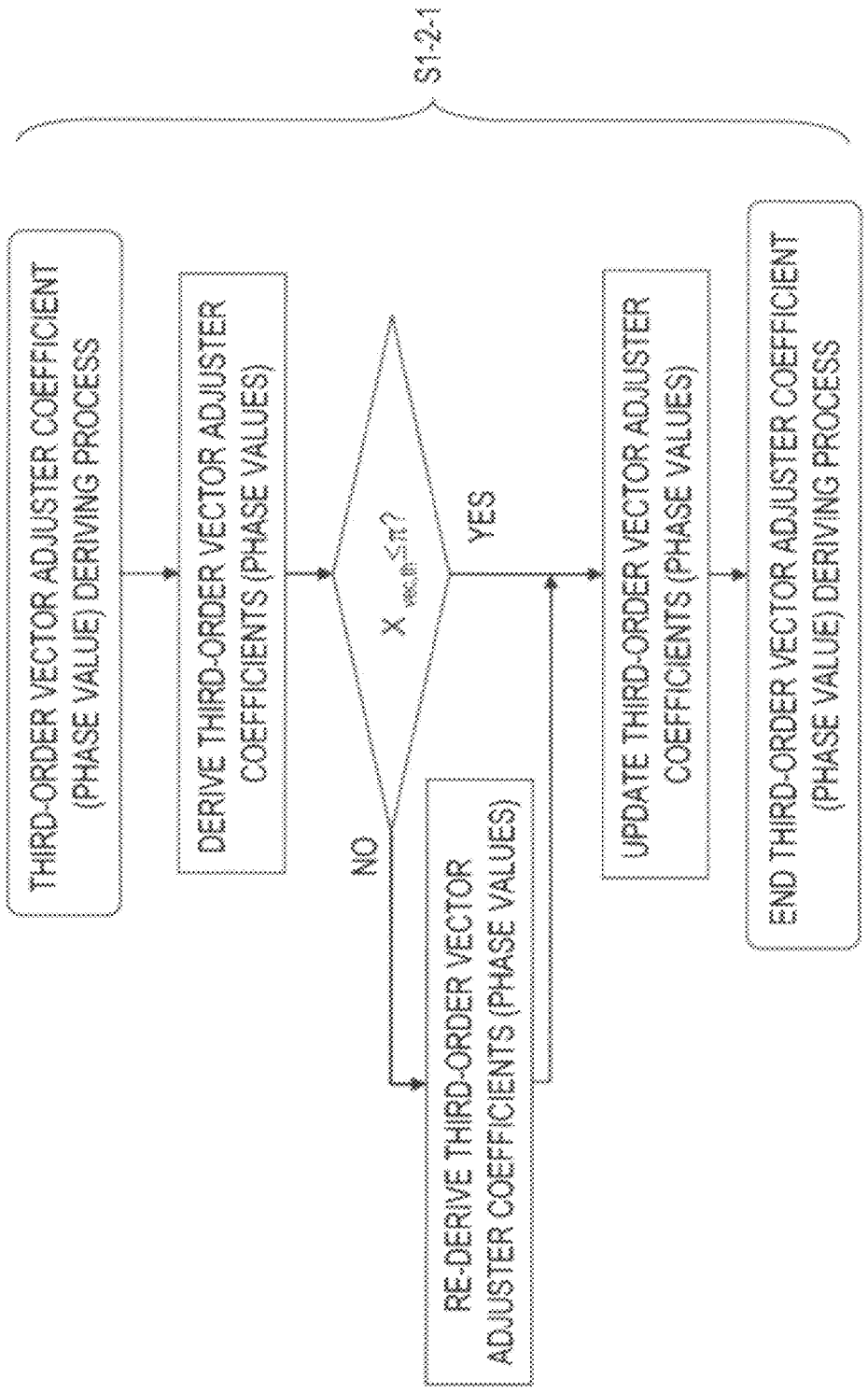
Figure 12:
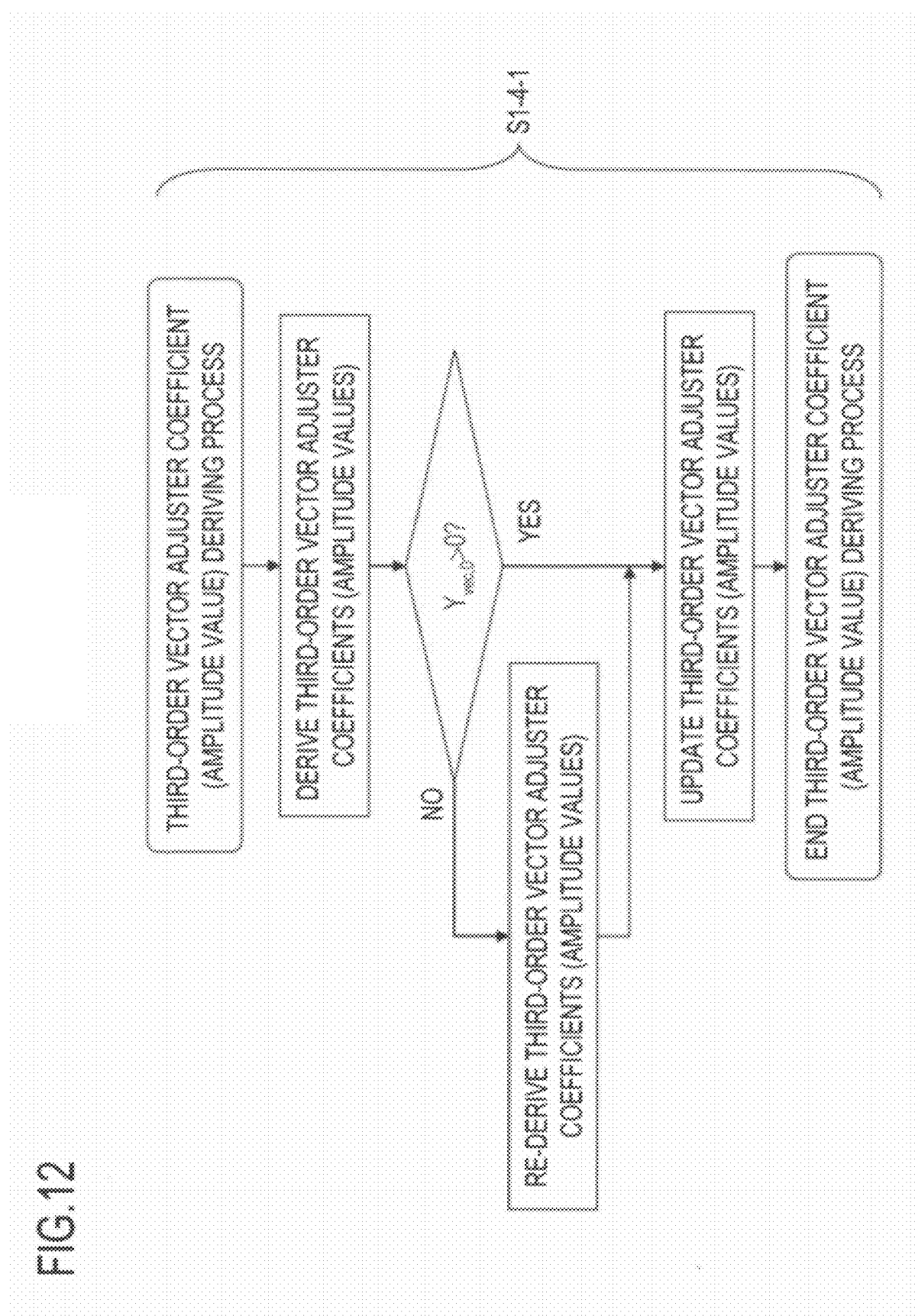
Figure 13:
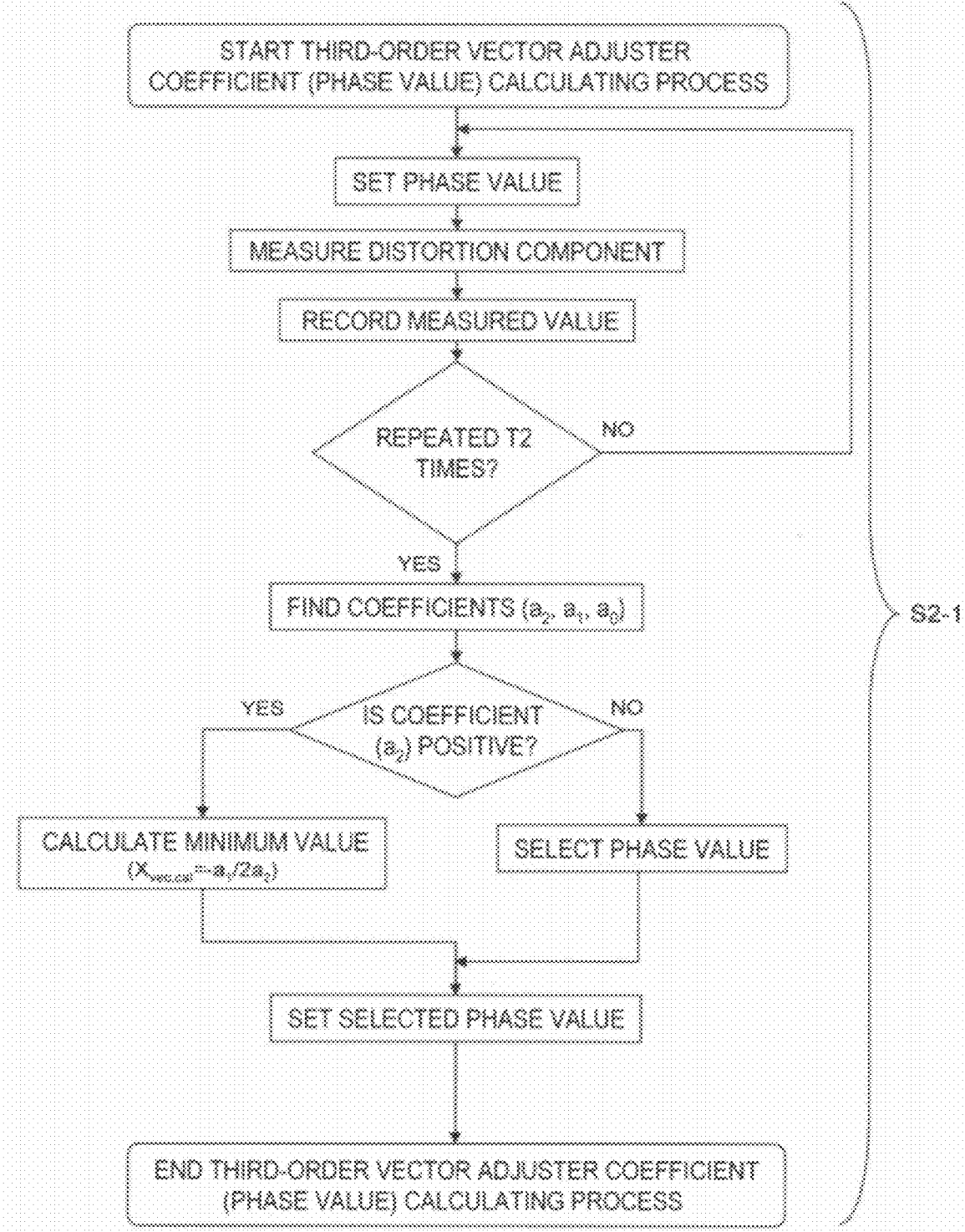
Figure 14:
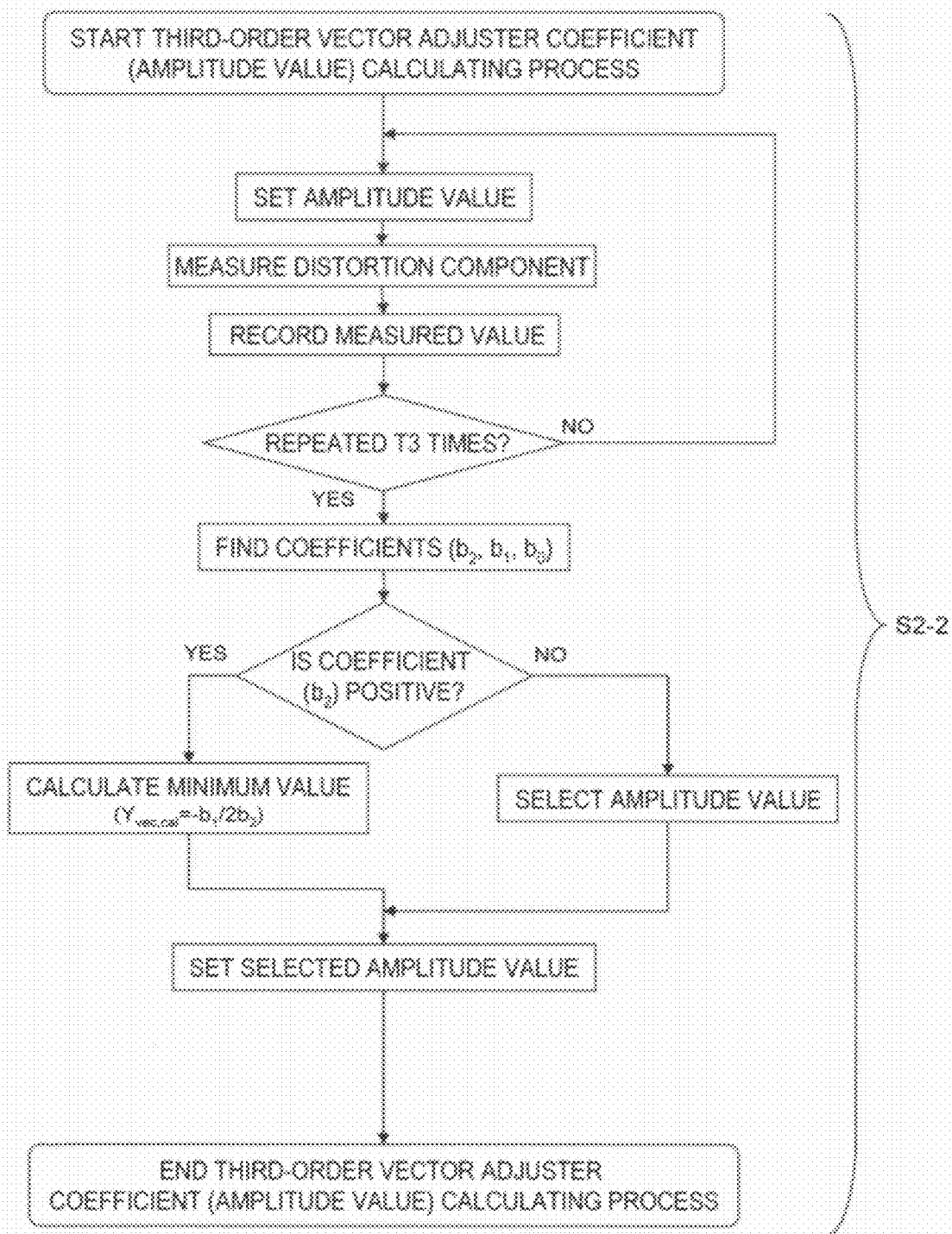
Figure 15:
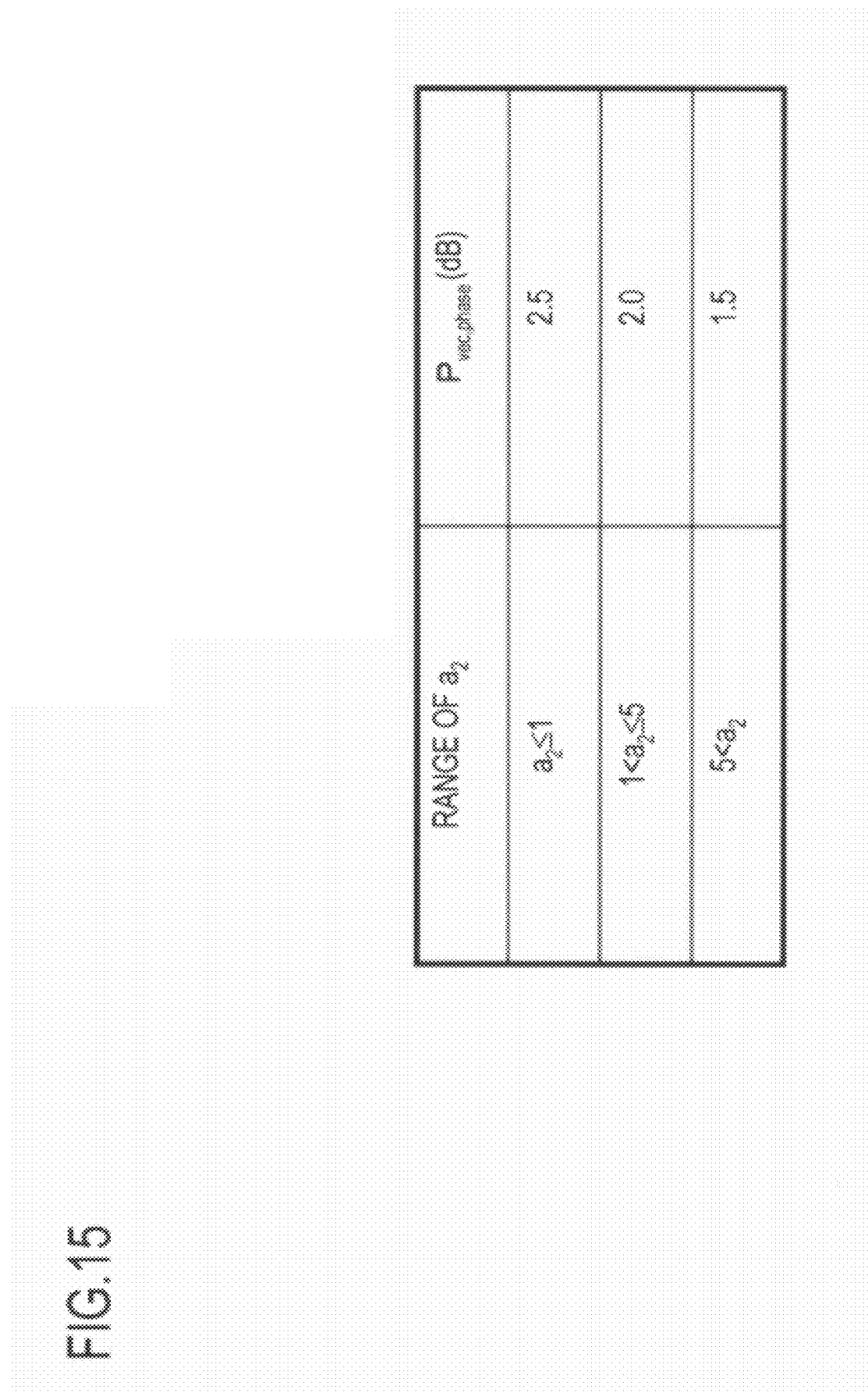
Figure 16:
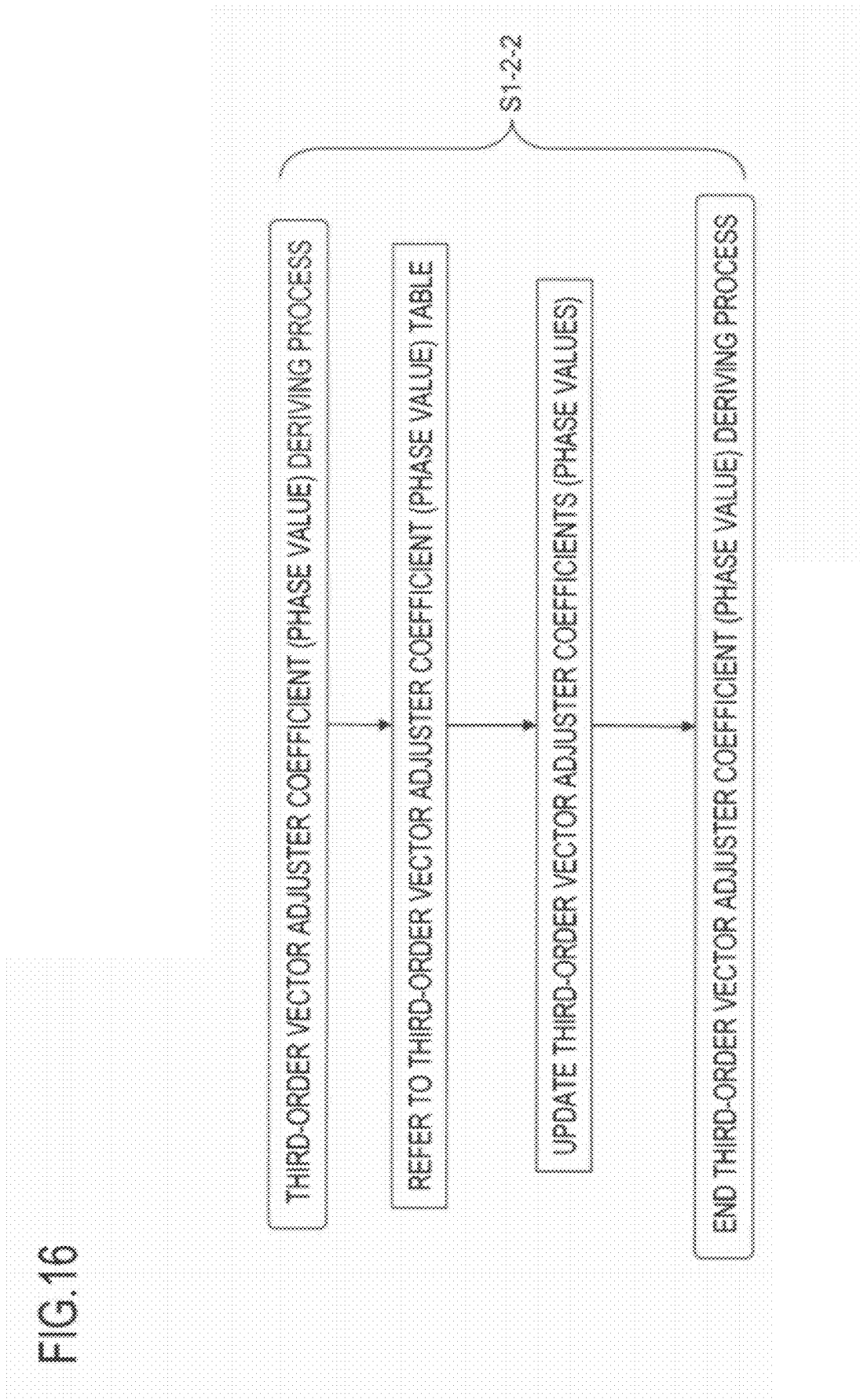
Figure 17:
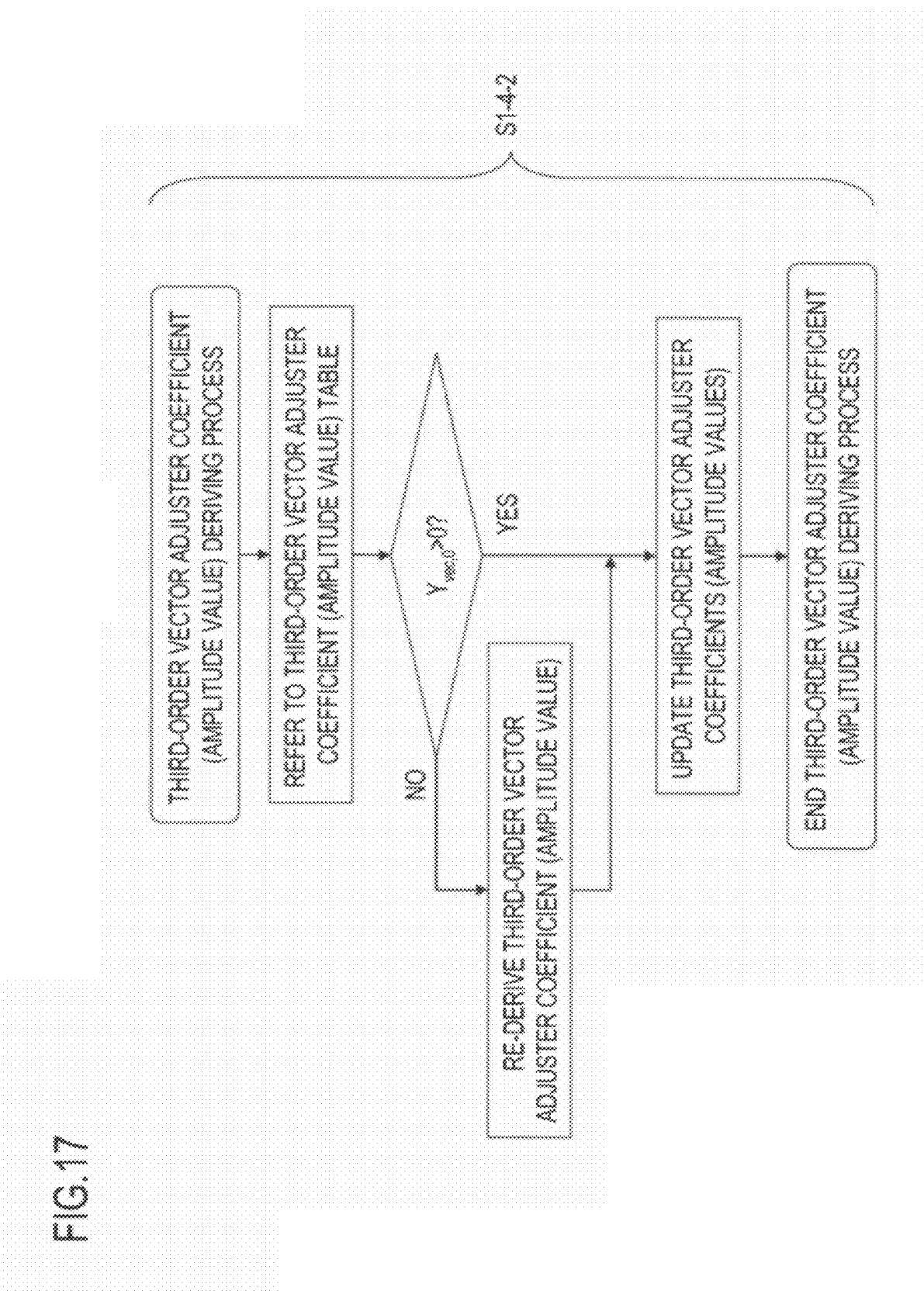
Figure 19:
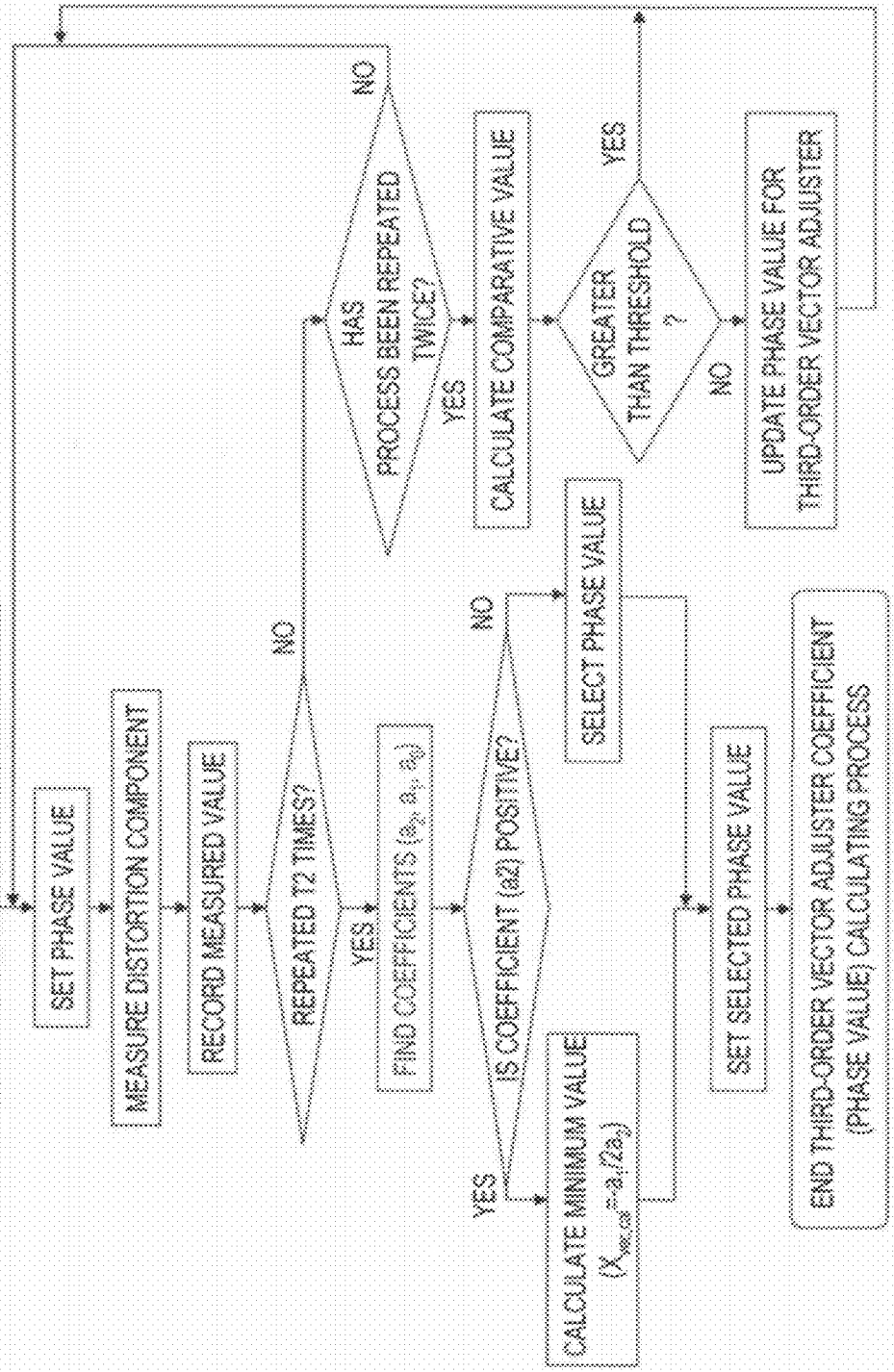
Figure 20:
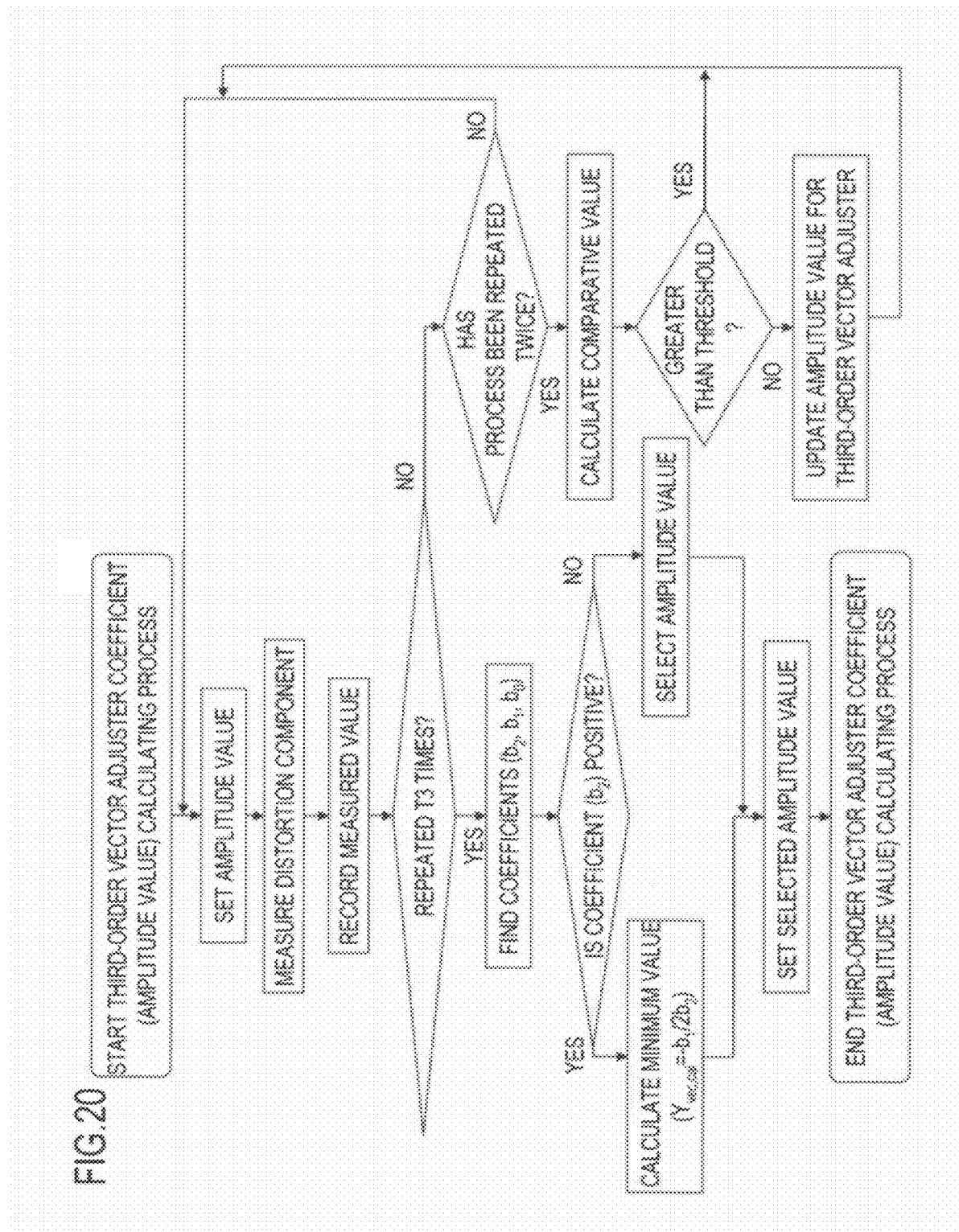
Figure 21:
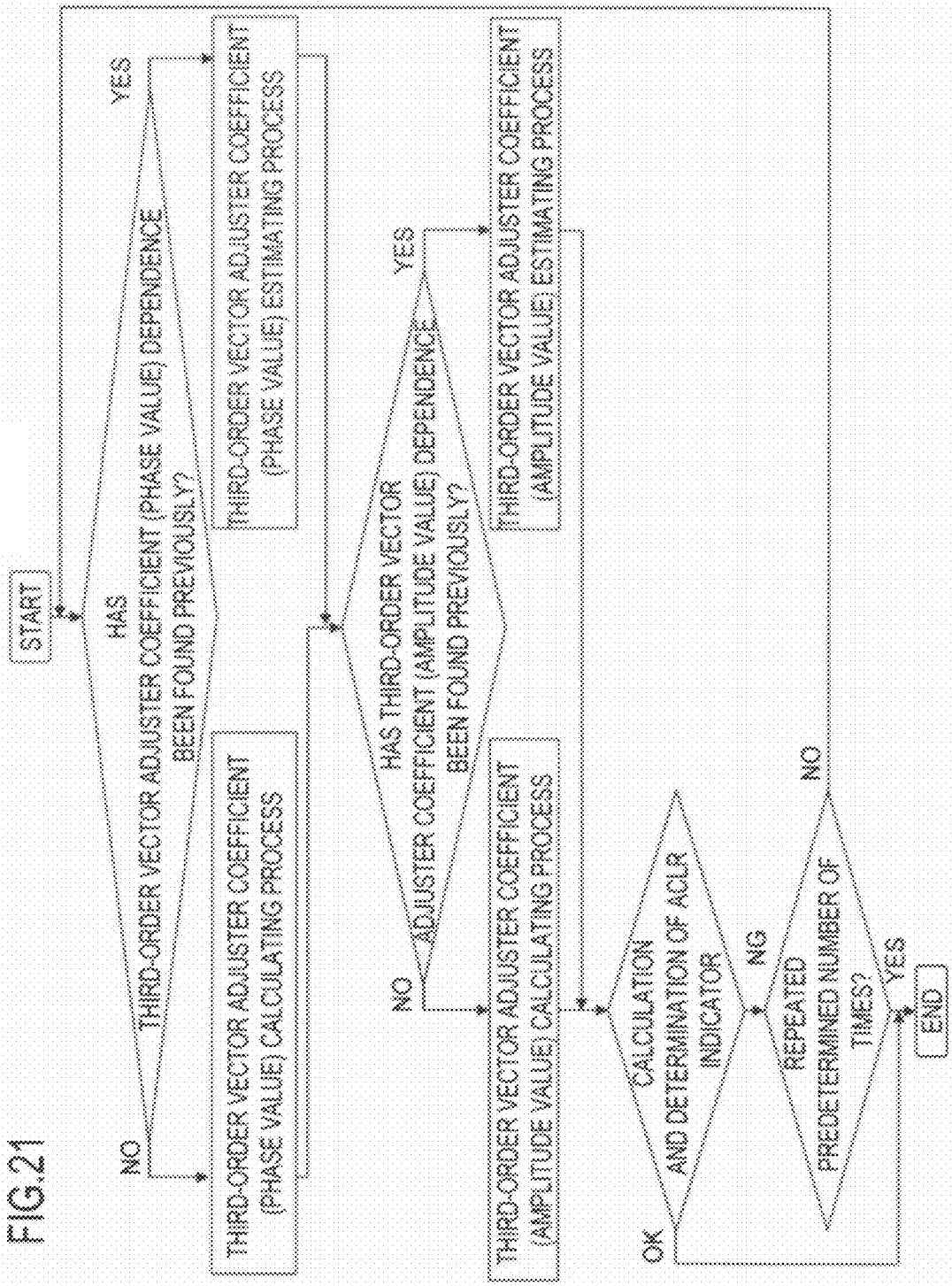
Figure 22:
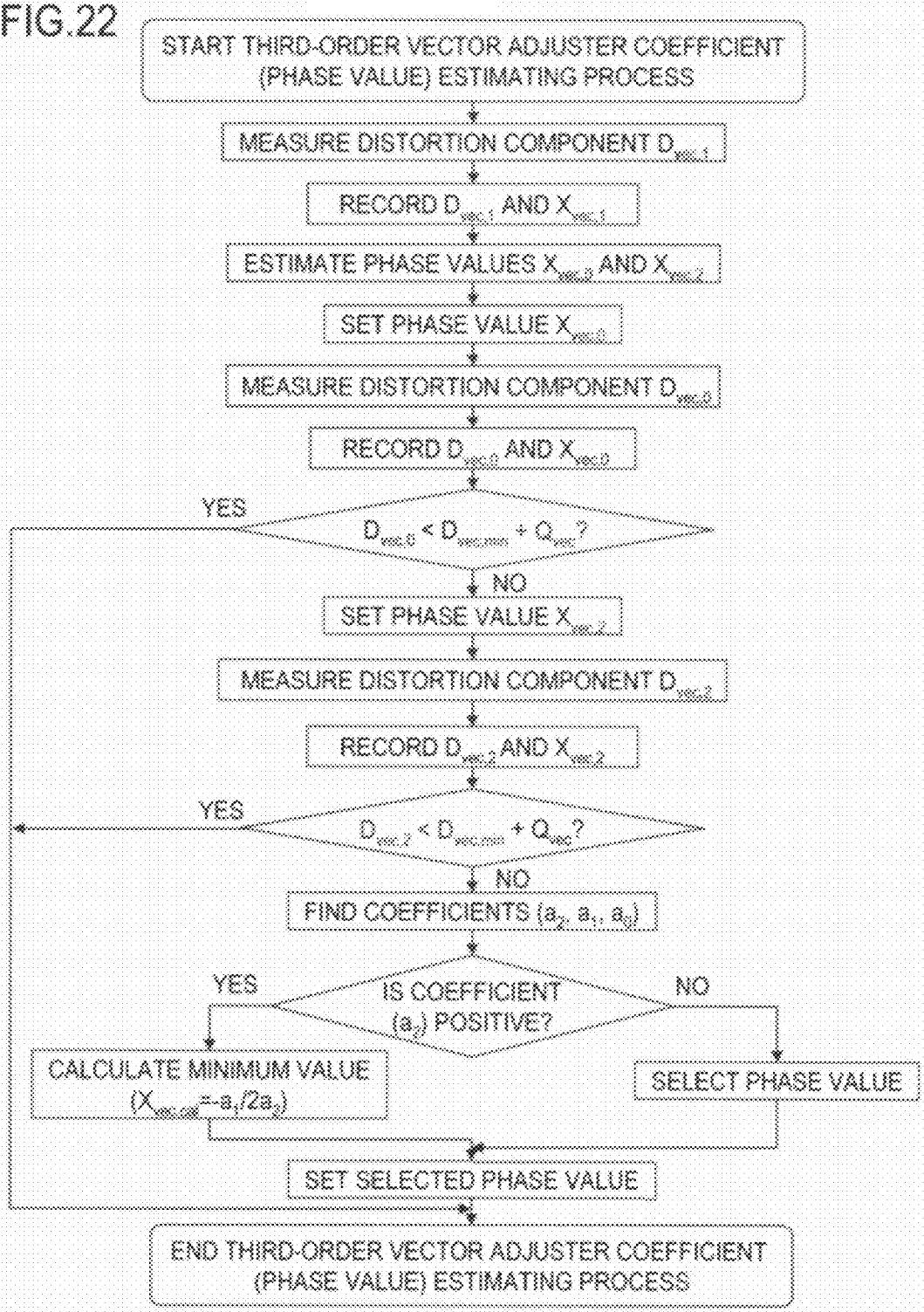
Figure 23:
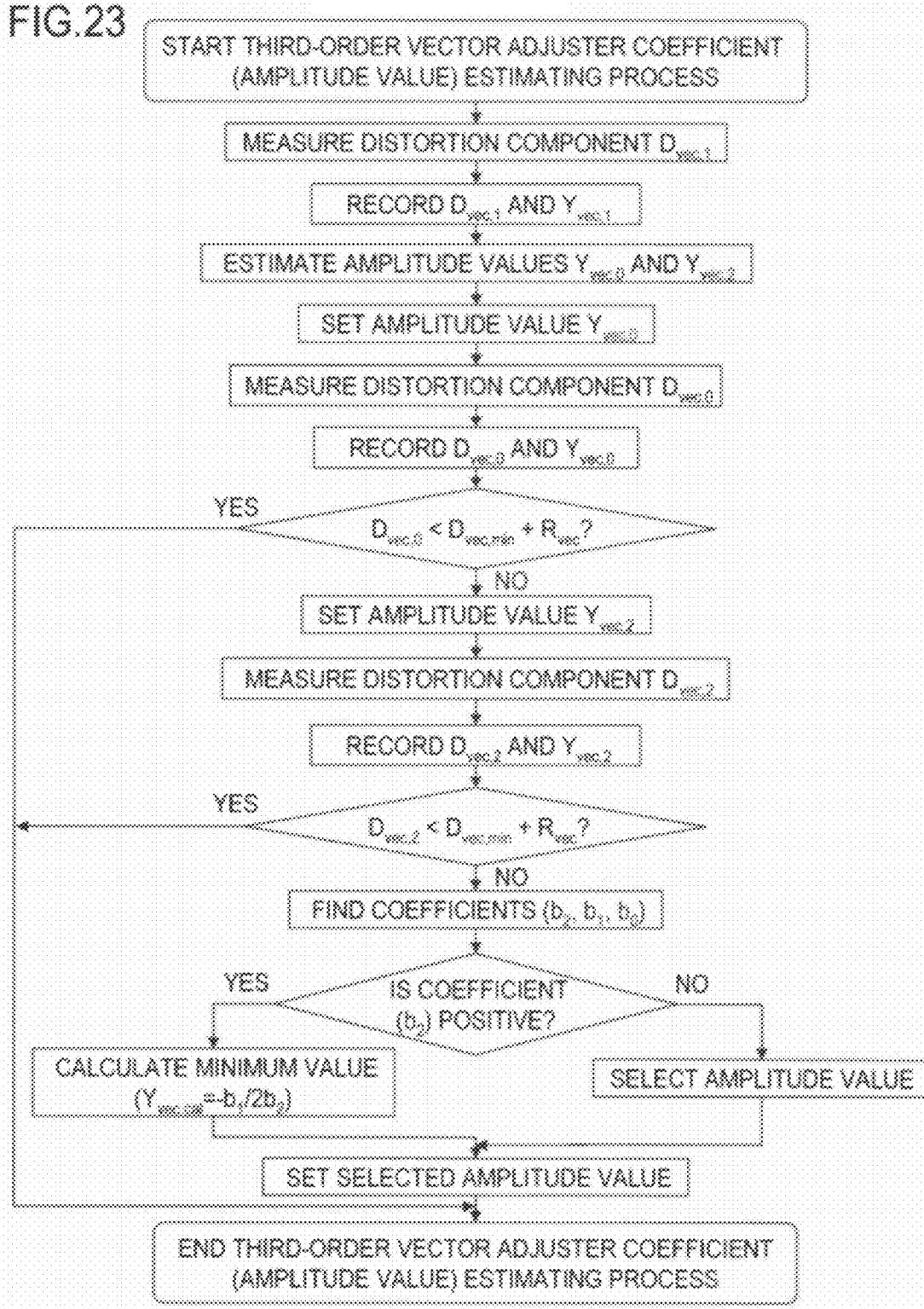
Figure 24:
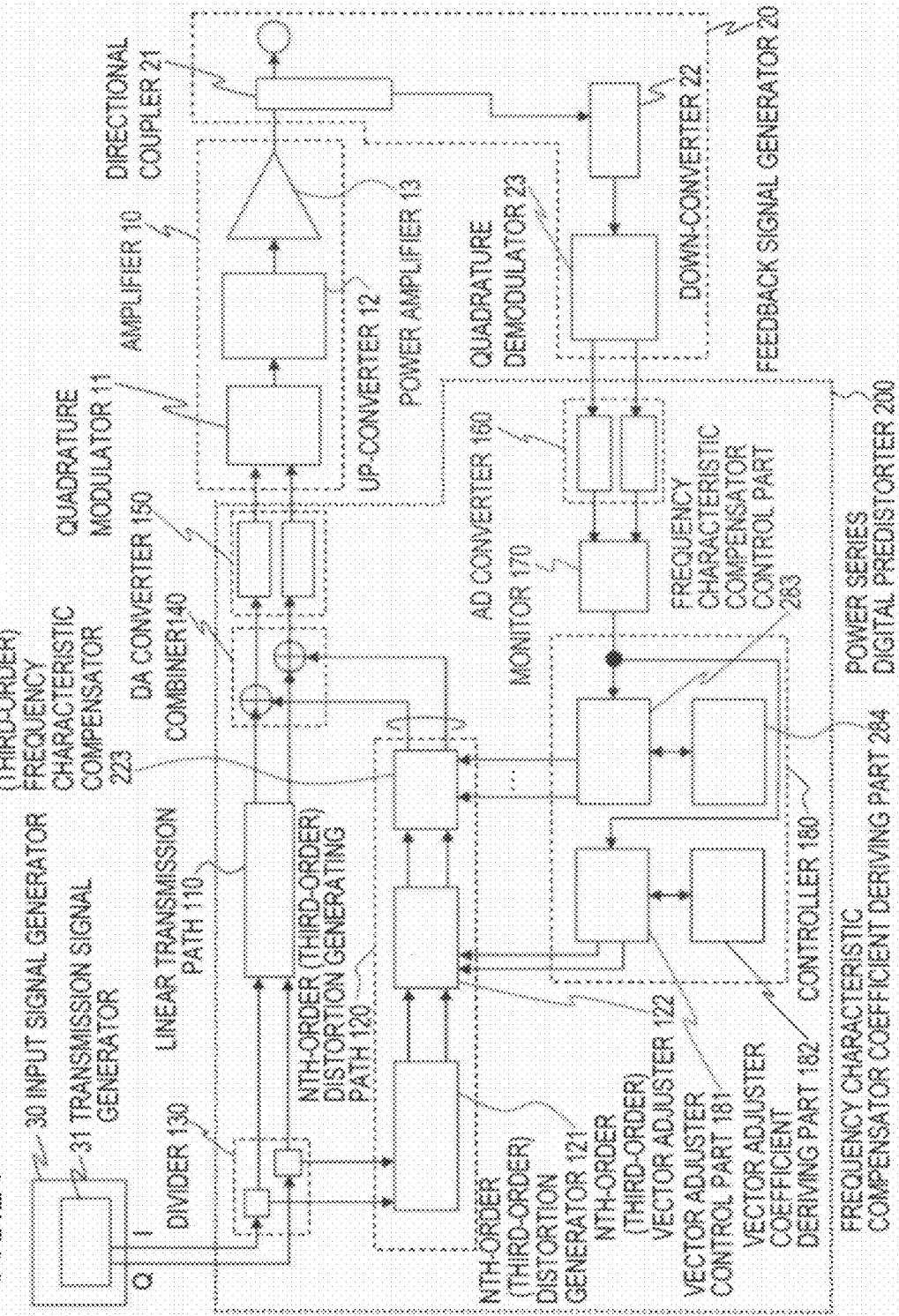
Figure 25:
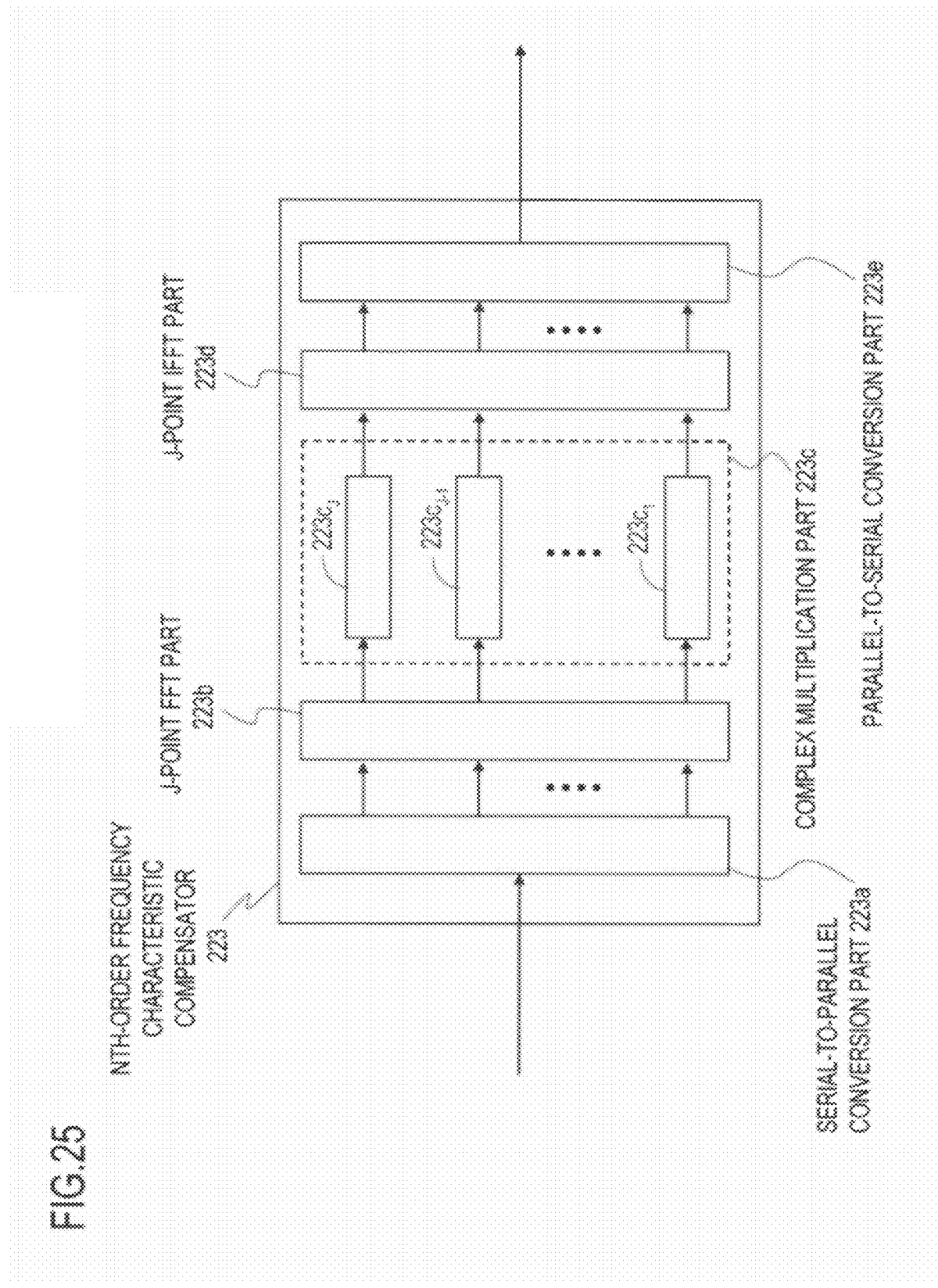
Figure 26:
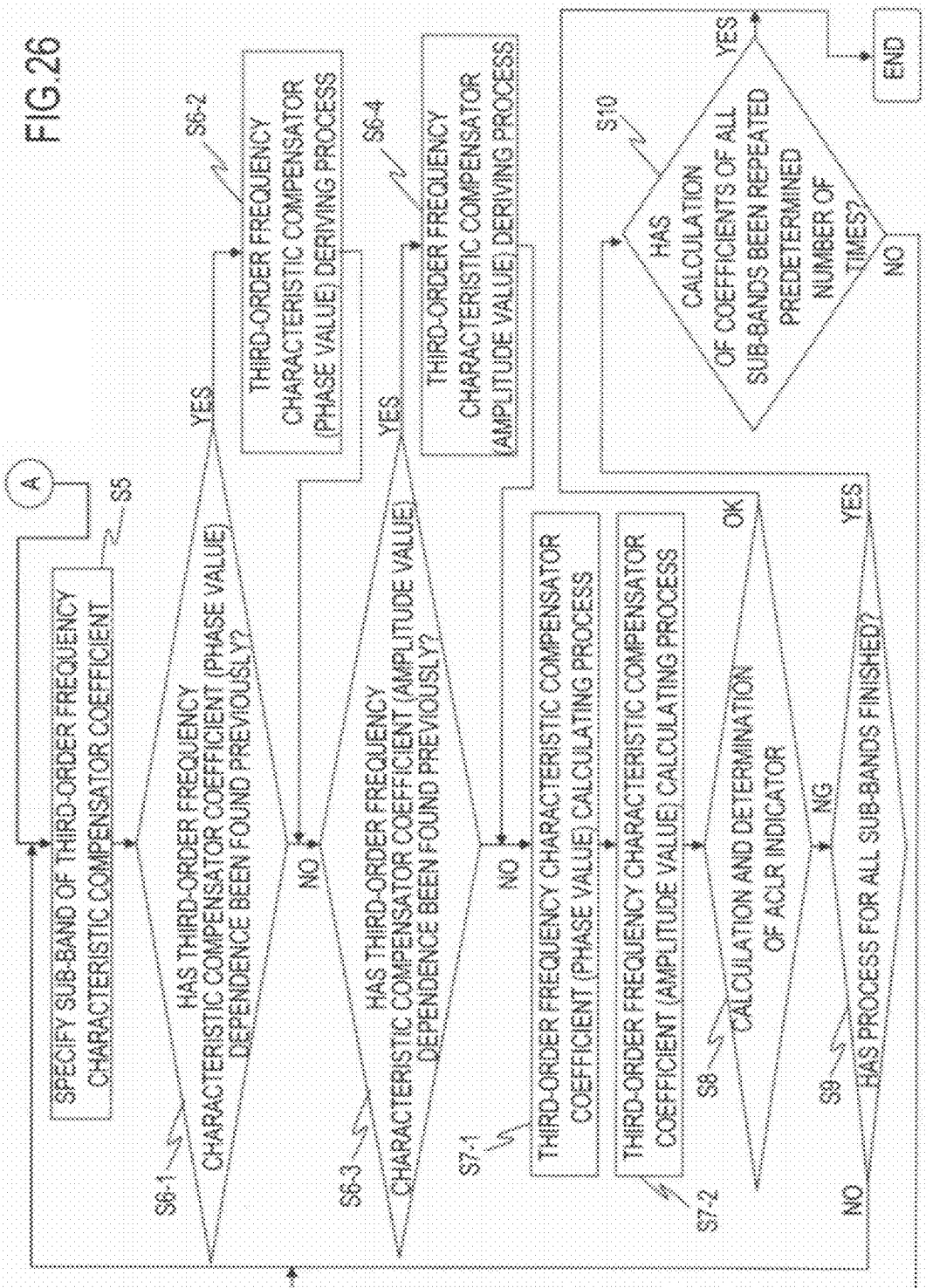

that minimizes a distortion component in a conventional power series digital predistorter;

FIG. 5 is a diagram illustrating a principle of updating a coefficient by the conventional power series digital predistorter;

FIG. 6 is a diagram illustrating an example in which there is a difference between a calculated coefficient that possibly minimizes a distortion component and a coefficient that actually minimizes the distortion component;

FIG. 7 is diagrams illustrating different calculated values of an evaluation function e for different $\Delta W$ in the conventional coefficient updating method;

FIG. 8 is a diagram illustrating a principle of updating a coefficient by a power series digital predistorter according to the present invention;

FIG. 9 is a functional block diagram of a power series digital predistorter according to a first embodiment;

FIG. 10 is a flowchart of a process performed in the power series digital predistorter according to the first embodiment;

FIG. 11 is a flowchart of third-order vector adjuster coefficient (phase value) deriving process flow 1;

FIG. 12 is a flowchart of third-order vector adjuster coefficient (amplitude value) deriving process flow 1;

FIG. 13 is a flowchart of third-order vector adjuster coefficient (phase value) calculating process flow 1;

FIG. 14 is a flowchart of third-order vector adjuster coefficient (amplitude value) calculating process flow 1;

FIG. 15 is an example of a lookup table used for changing an offset value according to the value of $a_2$ in third-order vector adjuster coefficient (phase value) deriving process flow 1;

FIG. 16 is a flowchart of third-order vector adjuster coefficient (phase value) deriving process flow 2;

FIG. 17 is a flowchart of third-order vector adjuster coefficient (amplitude value) deriving process flow 2;

FIG. 18 is an example of a table used for changing an offset value according to the value of $a_2$ or $b_2$ in third-order vector adjuster coefficient deriving process flow 2;

FIG. 19 is a flowchart of third-order vector adjuster coefficient (phase value) calculating process flow 2;

FIG. 20 is a flowchart of third-order vector adjuster coefficient (amplitude value) calculating process flow 2;

FIG. 21 is a flowchart of a process performed in a power series digital predistorter according to a second embodiment;

FIG. 22 is a flowchart of a third-order vector adjuster coefficient (phase value) estimating process;

FIG. 23 is a flowchart of a third-order vector adjuster coefficient (amplitude value) estimating process;

FIG. 24 is a functional block diagram of a power series digital predistorter according to a third embodiment;

FIG. 25 is a block diagram illustrating an exemplary configuration of a frequency characteristic compensator of the power series digital predistorter according to the third embodiment;

FIG. 26 is a flowchart of a process performed in the power series digital predistorter according to the third embodiment; and FIG. 27 is a graph of experimental results.

DETAILED DESCRIPTION OF THE EMBODIMENTS

Prior to describing embodiments in detail, a principle of an updating method according to the present invention will be described with reference to FIG. 8. It is assumed here that previously found dependence of a distortion component before update on an Nth-order vector adjuster coefficient is expressed by a quadratic function $f_1(W)$ illustrated in FIG. 8. At least three Nth-order vector adjuster coefficients, $W_0$, $W_1$ and $W_2$, to be used in updating an Nth-order vector adjuster coefficient that minimizes the distortion component are derived. Here, $W_1$ is a phase value (or an amplitude value) that minimizes $f_1(W)$, and $W_0$ and $W_2$ (where $W_0<W_1<W_2$) are phase values (or amplitude values) that differ in level from $f_1(W_1)$ by an offset value P. That is, $W_0$ and $W_2$ that yield $f_1(W_0)=f_1(W_2)=f_1(W_t)$ P (where P is a true value) are derived. Then $W_0$, $W_1$ and $W_2$ thus derived are set in the Nth-order vector adjuster in sequence and the level of the distortion component is measured with each phase value (or each amplitude value). The three sets of phase values (or amplitude values) and distortion component levels obtained are used to find a quadratic function $f_2(W)$ by the least square method. A phase value (or amplitude value) $W_{new}$ that minimizes $f_2(W)$ is calculated. The Nth-order vector adjuster coefficient is updated with the calculated phase value (or amplitude value) $W_{new}$.

In this way, according to the present invention, Nth-order vector adjuster coefficients $W_0$, $W_1$ and $W_2$ used in finding a new quadratic function $f_2(W)$ representing Nth-order vector adjuster coefficient dependence by the least square method are obtained based on the relationship $f_1(W_0)=f_1(W_2)=f_1(W_1)+P$. A large difference between distortion component levels that are obtained using the Nth-order vector adjuster coefficients $W_0$, $W_1$ and $W_2$ can be provided by setting an adequately large value of P. Consequently, the difficulty with conventional methods in setting appropriate $\Delta W$ can be avoided and the levels of distortion components can be reduced effectively and quickly. Embodiments of the present invention will be described below in detail.

[First Embodiment]

FIG. 9 illustrates a power series digital predistorter 100 of the present invention and its peripheral devices. The peripheral devices herein are amplifier 10, a feedback signal generator 20 which extracts a part of an output of the amplifier 10 and generates a signal to be fed back to the digital predistorter 100, and an input signal generator 30 including a transmission signal generator 31 which generates I- and Q-phase digital signals. The amplifier 10 and the feedback signal generator 20 are the same as those of the power series digital predistorter 500 described as the conventional art: Any bandwidth of the output signal from the input signal generator 30, number of subcarriers (in the case of an OFDM signal), and modulation scheme may be set for the output signal (hereinafter referred to as the "transmission signal"). The following description will be provided with respect to an example in which OFDM signals with a bandwidth of 3.84 MHz and with 64 subcarriers modulated with QPSK are used.

Figure 1:
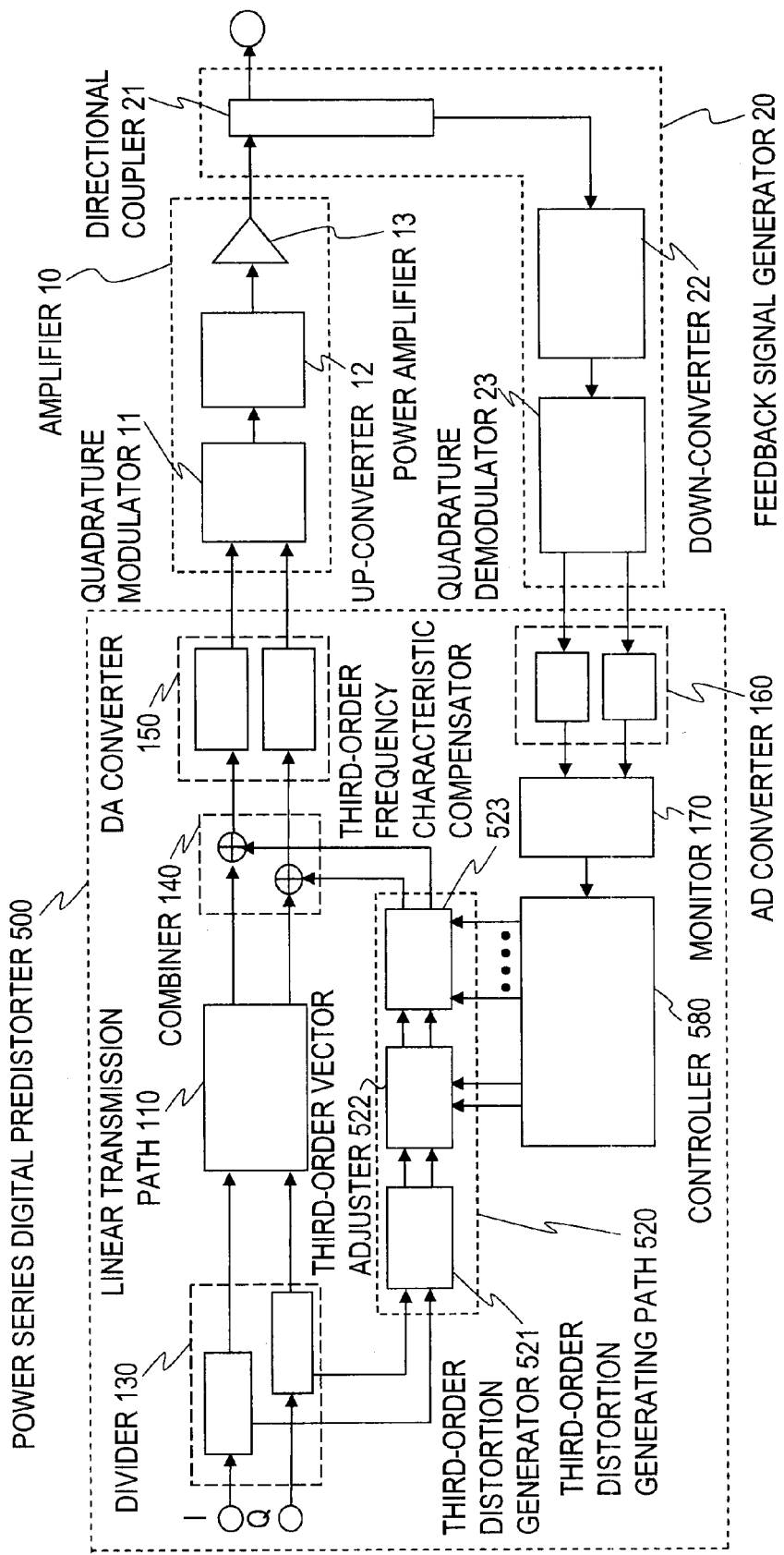
FIG. 1 is a block diagram illustrating an exemplary configuration of a conventional power series digital predistorter.

The power series digital predistorter 100 includes a linear transmission path 110, an Nth-order distortion generating path 120, a divider 130, a combiner 140, a DA converter 150, an AD converter 160, a monitor 170 and a controller 180. The linear transmission path 110 includes a delay circuit. The Nth-order distortion generating path 120 includes an Nth-order distortion generator 121, and an Nth-order vector adjuster 122. The divider 130 distributes signals of both phases generated in the transmission signal generator 31 to the linear transmission path 110 and the Nth-order distortion generating path 120. The combiner 140 combines a signal output from the linear transmission path 110 with a signal output from the Nth-order distortion generating path 120. The DA converter 150 converts analog signals output from the combiner 140 to digital signals. The AD converter 160 converts I- and Q-phase analog signals output from the feedback signal generator 20, which extracts a part of an output signal from the amplifier 10 as a feedback signal, into I- and Q-phase digital signals, respectively. The monitor 170 measures, from output signals of the AD converter 160, the power of signals input from the input signal generator 30 into the power series digital predistorter 100 and amplified by the power amplifier 13, and also measures the power of a distortion component produced in the power amplifier 13 in each of any predetermined frequency sub-bands. Based on the measurements by the monitor 170, the controller 180 calculates Nth-order vector adjuster coefficients including phase and amplitude values to be provided to the Nth-order vector adjuster 122. The components other than the Nth-order distortion generating path 120 and the controller 180 are the same as those of the conventional power series digital predistorter 500 illustrated in FIG. 1 that have the same reference numerals and therefore description of those components will be described only as necessary to understand the present invention.

The Nth-order distortion generator 121 raises each output signal from the divider 130 to the Nth power to generate an Nth-order distortion component. The Nth-order vector adjuster 122 multiplies each Nth-order distortion component generated by the Nth-order distortion generator 121 by an Nth-order vector adjuster coefficient provided from the controller 180 to adjust the phase and amplitude of the Nth-order distortion component.

The controller 180 includes a vector adjuster control part 181 and a vector adjuster coefficient deriving part 182. The vector adjuster control part 181 includes five functions. A first function is to provide a plurality of Nth-order vector adjuster coefficients used for measuring a distortion component and an Nth-order vector adjuster coefficient that minimizes the distortion component to the Nth-order vector adjuster 122. A second function is to record the plurality of Nth-order vector adjuster coefficients used for distortion component measurement and the plurality of measured distortion components obtained from the monitor 170 when the coefficients were applied to the Nth-order vector adjuster 122. A third function is to find dependence of the distortion components on the Nth-order vector adjuster coefficients from the plurality of measured distortion components recorded by the second function. A fourth function is to calculate an Nth-order vector adjuster coefficient that minimizes the distortion components from the Nth-order vector adjuster coefficient dependence found by the third function. A fifth function is to determine whether or not an indicator indicating the value of a distortion component meets a prespecified condition (for example whether or not the indicator is less than or equal to a target value) and if not, to calculate anew an Nth-order vector adjuster coefficient that minimizes the distortion component. The vector adjuster coefficient deriving part 182 includes two functions. A first function is to derive a plurality of Nth-order vector adjuster coefficients to be set in the Nth-order vector adjuster 122 by the vector adjuster control part 181 for measuring a distortion component on the basis of previously found Nth-order vector adjuster coefficient dependence, if any, when the vector adjuster control part 181 attempts to find dependence of a distortion component on an Nth-order vector adjuster coefficient. A second function is to provide the plurality of Nth-order vector adjuster coefficients for distortion component measurement derived by the first function to the vector adjuster control part 181.

A flow of process of determining that the indicator of the value of a distortion component meets a prespecified condition will be described with reference to FIG. 10. The indicator of the value of a distortion component used here is the ACLR (Adjacent Channel Leakage power Ratio). The ACLR is the ratio of the power in a third-order distortion component upper/lower band (a bandwidth of 3.84 MHz) at a detuning point of ±5 MHz from the center frequency to the power in the transmission signal bandwidth (a bandwidth of 3.84 MHz), for example. The detuning points from the center frequency and the bandwidths are not limited to these; any detuning points and bandwidths may be specified. For convenience, the process will be described with respect to an example in which N=3, that is, the Nth-order distortion generating path 120 is a third-order distortion generating path.

First, the vector adjuster coefficient deriving part 182 determines whether or not dependence of a distortion component on a third-order vector adjuster coefficient (phase value) has been found previously (S1-1). If third-order vector adjuster coefficient (phase value) dependence has been found previously, the vector adjuster coefficient deriving part 182 performs a third-order vector adjuster coefficient (phase value) deriving process (S1-2-1 or S1-2-2), which will be described later. Then, the vector adjuster coefficient deriving part 182 determines whether or not dependence of the distortion component on a third-order vector adjuster coefficient (amplitude value) has been found previously (S1-3). On the other hand, if the third-order vector adjuster coefficient (phase value) dependence has not been determined, the vector adjuster coefficient deriving part 182 does not perform the third-order vector adjuster coefficient (phase value) deriving process but instead determines whether or not dependence of the distortion component on a third-order vector adjuster coefficient (amplitude value) has been found previously (S1-3). If third-order vector adjuster coefficient (amplitude value) dependence has been found previously, the vector adjuster coefficient deriving part 182 performs a third-order vector adjuster coefficient (amplitude value) deriving process (S1-4-1 or S1-4-2), which will be described later. Then, the vector adjuster control part 181 performs a third-order vector adjuster coefficient (phase value) calculating process (S2-1), which will be described later. On the other hand, if third-order vector adjuster coefficient (amplitude value) dependence has not been found, the third-order vector adjuster coefficient (amplitude value) deriving process is not performed. Instead, the vector adjuster control part 181 performs the third-order vector adjuster coefficient (phase value) calculating process (S2-1), which will be descried later. After completion of the third-order vector adjuster coefficient (phase value) calculating process, a third-order vector adjuster coefficient (amplitude value) calculating process (S2-2), which will be described later, is performed. After completion of the third-order vector adjuster coefficient (amplitude value) calculating process, the vector adjuster control part 181 calculates the ACLR from the power in the transmission signal band and the power in the distortion component sub-band measured by the monitor 170 and determines whether or not the ACLR calculated is less than a target value. If the ACLR is less than the target value, third-order vector adjuster coefficient calculation will end (S3). If the ACLR is greater than or equal to the target value, the process returns to the determination as to whether third-order vector adjuster coefficient (phase value) dependence has been found (S1-1). If the ACLR does not decrease below the target value after the sequence from S1-1 to S3 is repeated a predetermined number of times, the vector adjuster control part 181 will end the third-order vector adjuster coefficient calculating process (S4).

The determination as to whether third-order vector adjuster coefficient (phase value) dependence has been found or not and the third-order vector adjuster coefficient (phase value) deriving process in FIG. 10 may be performed just before the third-order vector adjuster coefficient (phase value) calculating process. Also, the determination as to whether third-order vector adjuster coefficient (amplitude value) dependence has been found or not and the third-order vector adjuster coefficient (amplitude value) deriving process may be performed just before the third-order vector adjuster coefficient (amplitude value) calculating process.

The third-order vector adjuster coefficient (phase value) deriving process and the third-order vector adjuster coefficient (amplitude value) deriving process in the vector adjuster coefficient deriving part 182 follow the flowcharts in FIGS. 11 and 12, respectively (hereinafter the processes are referred to as the "third-order vector adjuster coefficient (phase value) deriving process flow 1" and the "third-order vector adjuster coefficient (amplitude value) deriving process flow 1", respectively). The third-order vector adjuster coefficient (phase value) calculating process and the third-order vector adjuster coefficient (amplitude value) calculating process in the vector adjuster control part 181 follow the flowchart in FIGS. 13 and 14, respectively (hereinafter the processes are referred to as the "third-order vector adjuster coefficient (phase value) calculating process flow 1" and the "third-order vector adjuster coefficient (amplitude value) calculating process flow 1", respectively). In these processes, the phase value provided from the vector adjuster control part 181 to the third-order vector adjuster 122 for measuring a distortion component is denoted by $X_{vec.t2}$ (where t2=0, 1, ..., T2−1) and the amplitude value for measuring the distortion component is denoted by $Y_{vec.t3}$ (where t3=0, 1, ..., T3−1). Here, T2 is the number of times a distortion component is measured with different phase values in order to find the coefficients ($a_2$, $a_1$, $a_0$) of a quadratic function ($D_{vec.phase} = a_2 X_{vec}^2 + a_1 X_{vec} + a_0$) representing dependence of a distortion component $D_{vec.phase}$ on a third-order vector adjuster coefficient (phase value) by the least square method. Similarly, T3 is the number of times the distortion component is measured with different amplitude values in order to find the coefficients ($b_2$, $b_1$, $b_0$) of a quadratic function ($D_{vec.amp} = b_2 Y_{vec}^2 + b_1 Y_{vec} + b_0$) representing dependence of a distortion component $D_{vec.amp}$ on a third-order vector adjuster coefficient (amplitude value) by the least square method. The minimum values of both T2 and T3 are 3. In the following description, T2=3 and T3=3 unless otherwise specified.

<Third-Order Vector Adjuster Coefficient (Phase Value) Deriving Process Flow 1>

FIG. 11 illustrates third-order vector adjuster coefficient (phase value) deriving process flow 1 (S1-2-1 in FIG. 10). The vector adjuster coefficient deriving part 182 first calculates the minimum value $D_{min}$ ($= a_2 X_{vec.1}^2 + a_1 X_{vec.1} + a_0$) of a quadratic function representing previously found third-order vector adjuster coefficient (phase value) dependence, from the coefficients ($a_2$, $a_1$, $a_0$) of the quadrature function, where $X_{vec.1} = a_1/2a_2$. The vector adjuster coefficient deriving part 182 then uses an offset value $P_{vec.phase}$ (dB) for $D_{min}$ to calculate $$X_{vec,0} = X_{vec,1} - \sqrt{(4a_2(10^{0.1 P_{vec,phase}} D_{min} - a_0) + a_1^2)/4a_2^2}$$

and $$X_{vec,2} = X_{vec,1} + \sqrt{(4a_2(10^{0.1 P_{vec,phase}} D_{min} - a_0) + a_1^2)/4a_2^2}$$

that yield $$10^{0.1 P_{vec,phase}} D_{min} = a_2 X_{vec}^2 + a_1 X_{vec} + a_0$$

("DERIVE THIRD-ORDER VECTOR ADJUSTER COEFFICIENTS (PHASE VALUES)" in FIG. 11), After $X_{vec.0}$ and $X_{vec.2}$ are calculated, $X_{vec.th} = |X_{vec.0} - X_{vec.2}|$ is calculated and determination is made as to whether or not $X_{vec.th}$ exceeds π. If $X_{vec.th}$ does not exceed π, then $X_{vec.0}$, $X_{vec.1}$ and $X_{vec.2}$ are directly provided to the vector adjuster control part 181 ("UPDATE THIRD-ORDER VECTOR ADJUSTER COEFFICIENTS (PHASE VALUES)" in FIG. 11), and then the third-order vector adjuster coefficient (phase value) deriving process will end. On the other hand, if the $X_{vec.th}$ exceeds π, then $X_{vec.0}$ is replaced with $X_{vec.1} - \gamma_{vec.0}$ and $X_{vec.2}$ is replaced with $X_{vec.1} + \gamma_{vec1}$ where $\gamma_{vec.0}$ and $\gamma_{vec.1}$ are preset offset values in the ranges $0 < \gamma_{vec.0} \leq \frac{1}{2}\pi$ and $0 < \gamma_{vec.1} \leq \frac{1}{2}\pi$, respectively ("RE-DERIVE THIRD-ORDER VECTOR ADJUSTER COEFFICIENTS (PHASE VALUES)" in FIG. 11). The calculated $X_{vec.0}$, $X_{vec1}$, and $X_{vex.2}$ are provided to the vector adjuster control part 181 and then the third-order vector adjuster coefficient (phase value) deriving process will end.

While the offset value $P_{vec.phase}$ is the same value used in common in the third-order vector adjuster coefficient (phase value) deriving process flow 1, the offset value $P_{vec.phase}$ may be changed depending on the value of $a_2$. For example, a lookup table in which a plurality of offset values $P_{vec.phase}$ are associated with different values of coefficient $a_2$ may be provided beforehand and reference may be made to the lookup table to change the offset value $P_{vec.phase}$ according to the value of $a_2$. An example of the lookup table is illustrated in FIG. 15. In the lookup table, the range of $a_2$ is divided into three. When $a_2 \leq 1$, $P_{vec.phase} = 2.5$ dB, when $1 < a_2 \leq 5$, $P_{vec.phase} = 2.0$ dB, and when $5 < a_2$, $P_{vec.phase} = 1.5$ dB. This is because when the value of $a_2$ is small, the third-order vector adjuster coefficient (phase value) for minimizing the distortion component can be more precisely calculated by increasing $P_{vec.phase}$.

<Third-Order Vector Adjuster Coefficient (Amplitude Value) Deriving Process Flow 1>

FIG. 12 illustrates third-order vector adjuster coefficient (amplitude value) deriving process flow 1 (S1-4-1 in FIG. 10). The vector adjuster coefficient deriving part 182 first calculates the minimum value $D_{min}$ ($= b_2 Y_{vec.1}^2 + b_1 Y_{vec.1} + b_0$) of a quadratic function representing a previously found third-order vector adjuster coefficient (amplitude value) dependence, from the coefficients ($b_2$, $b_1$, $b_0$) of the quadrature function, where $Y_{vec.1} = -b_1/2b_2$. The vector adjuster coefficient deriving part 182 then uses an offset value $P_{vec.amp}$ (dB) for $D_{min}$ to calculate $$Y_{vec,0} = Y_{vec,1} - \sqrt{(4b_2(10^{0.1 P_{vec,amp}} D_{min} - b_0) + b_1^2)/4b_2^2}$$

and $$Y_{vec,2} = Y_{vec,1} + \sqrt{(4b_2(10^{0.1 P_{vec,amp}} D_{min} - b_0) + b_1^2)/4b_2^2}$$

that yield $$10^{0.1 P_{vec,amp}} D_{min} = b_2 Y_{vec}^2 + b_1 Y_{vec} + b_0$$

("DERIVE THIRD-ORDER VECTOR ADJUSTER COEFFICIENTS (AMPLITUDE VALUES)" in FIG. 12). After $Y_{vec.0}$ and $Y_{vec.2}$ are calculated, determination is made as to whether $Y_{vec.0} > 0$. If $Y_{vec.0} > 0$, then $Y_{vec.0}$, $Y_{vec.1}$ and $Y_{vec.2}$ are directly provided to the vector adjuster control part 181 ("UPDATE THIRD-ORDER VECTOR ADJUSTER COEFFICIENTS (AMPLITUDE VALUES)" in FIG. 12), and then the third-order vector adjuster coefficient (amplitude value) deriving process will end. On the other hand, if $Y_{vec.0}$ is less than or equal to 0, then $Y_{vec.0}$ is set to $Y_{vec.0} = \lambda_{vec.0} \cdot Y_{vec.1}$, where $\lambda_{vec0}$ is a prespecified offset value in the range $0 < \lambda_{vec.0} < 1$ ("RE-DERIVE THIRD-ORDER VECTOR ADJUSTER COEFFICIENTS (AMPLITUDE VALUES)" in FIG. 12). The calculated $Y_{vec.0}$, $Y_{vec.1}$ and $Y_{vec.2}$ are provided to the vector adjuster control part 181 and then the third-order vector adjuster coefficient (amplitude value) deriving process will end.

As in the third-order vector adjuster coefficient (phase value) deriving process, a lookup table may be provided beforehand and reference may be made to the lookup table to change the offset value $P_{vec.amp}$ according to the value of $b_2$ in the third-order vector adjuster coefficient (amplitude value) deriving process.

<Third-Order Vector Adjuster Coefficient (Phase Value) Calculating Process Flow 1>

Figure 2:
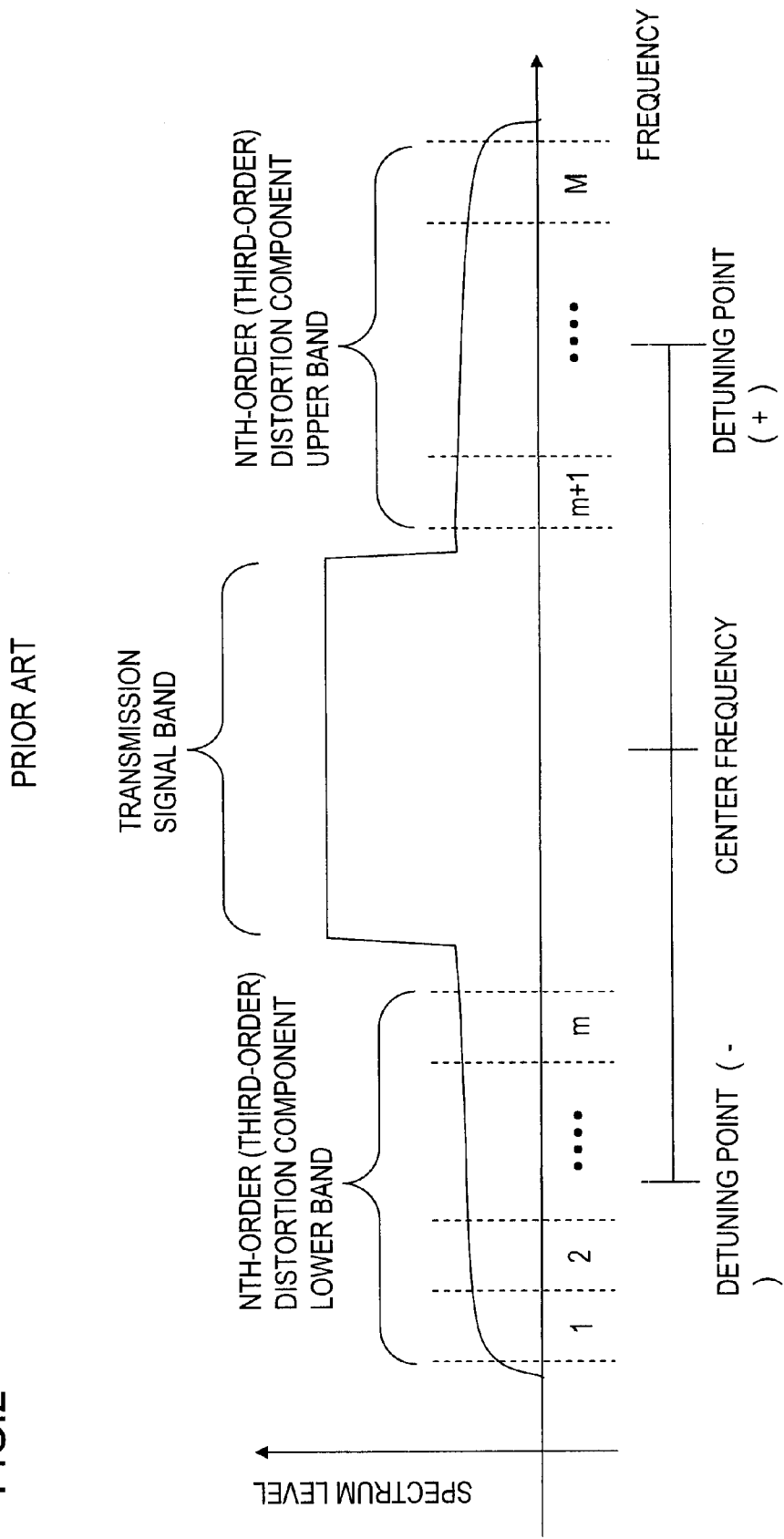
FIG. 2 is a conceptual diagram illustrating division of the band of distortion components.

FIG. 13 illustrates third-order vector adjuster coefficient (phase value) calculating process flow 1 (S2-1 in FIG. 10). The vector adjuster control part 181 sets a phase value $X_{vec.t2}$ in the third-order vector adjuster 122 ("SET PHASE VALUE" in FIG. 13). The monitor 170 measures the power $D_{vec.t2}$ of a distortion component output from the power amplifier 13 at the time ("MEASURE DISTORTION COMPONENT" in FIG. 13). If third-order vector adjuster coefficient (phase value) dependence has not been found previously, a prespecified phase value $X_{vec.t2}$ is used. If third-order vector adjuster coefficient (phase value) dependence has been found previously, the phase value derived in the third-order vector adjuster coefficient (phase value) deriving process flow 1 is used. The power of a distortion component only in predetermined one of the distortion component upper and lower bands depicted in FIG. 2 is measured. Then the vector adjuster control part 181 records the set of measured distortion component power $D_{vec.t2}$ and phase value $X_{vec.t2}$ provided to the third-order vector adjuster ("RECORD MEASURED VALUE" in FIG. 13). The vector adjuster control part 181 then determines whether or not the sequence from setting of phase value to recording of measured value has been repeated T2 times. If it is determined that the sequence has not been repeated T2 times, the process returns to the phase value setting, where the next phase value $X_{vec.t2+1}$ is set in the third-order vector adjuster 122, then the sequence to the measured value recording is repeated. On the other hand, if it is determined that the sequence has been repeated T2 times, new coefficients $(a_2, a_1, a_0)$ of the quadratic function $(D_{vec.phase}=a_2 X_{vec}^2+a_1 X_{vec}+a_0)$ are found by the least square method ("FIND COEFFICIENTS $(a_2, a_1, a_0)$" in FIG. 13) and determination is made as to whether the coefficient $a_2$ is positive or not. If $a_2$ is positive, the phase value $X_{vec.cal}=-a_1/2a_2$ that minimizes the quadratic function is calculated ("CALCULATE MINIMUM VALUE $(X_{vec.cal}=-a_1/2a_2)$" in FIG. 13) and the phase value is set in the third-order vector adjuster 122 ("SET SELECTED PHASE VALUE" in FIG. 13). On the other hand, if $a_2$ is not positive, it is assumed that coefficients $(a_2, a_1, a_0)$ have not been found, a phase value that yielded the smallest distortion component is selected as $X_{vec.cal}$ from among the phase values $X_{vec.0}$, $X_{vec.1}$ and $X_{vec.2}$ set in the third-order vector adjuster 122 ("SELECT PHASE VALUE" in FIG. 13), and the selected phase value $X_{vec.cal}$ is set in the third-order vector adjuster 122. If the ACLR obtained with $X_{vec.cal}$ selected when $a_2$ is not positive is greater than or equal to the target value, the third-order vector adjuster coefficient (phase value) calculating process is performed again (see FIG. 10). If this happens, $X'_{vec.0}$ and $X'_{vec.2}$ are calculated as $X'_{vec.0}=X_{vec.1}-\alpha_{vec.0}|X_{vec.0}-X_{vec.1}|$ and $X'_{vec.2}=X_{vec.1}+\alpha_{vec.2}|X_{vec.2}-X_{vec.1}|$, respectively, where $\alpha_{vec.0}$ and $\alpha_{vec.2}$ are prespecified offset values ($0<\alpha_{vec.0}<1$ and $0<\alpha_{vec.2}<1$). Also, among the phase values $X_{vec.0}$, $X_{vec.1}$ and $X_{vec.2}$ set in the third-order vector adjuster 122, a phase value that yielded the smallest distortion component is obtained as $X'_{vec.1}$. Then $X'_{vec.0}$, $X'_{vec.1}$ and $X'_{vec.2}$ are set in the vector adjuster 122 when S2-1 is executed again.

<Third-Order Vector Adjuster Coefficient (Amplitude Value) Calculating Process Flow 1>

FIG. 14 illustrates third-order vector adjuster coefficient (amplitude value) calculating process flow 1 (S2-2 in FIG. 10). The vector adjuster control part 181 sets an amplitude value $Y_{vec.t3}$ in the third-order vector adjuster 122 ("SET AMPLITUDE VALUE" in FIG. 14). The monitor 170 measures the power $D_{vec.t3}$ of a distortion component output from the power amplifier at the time ("MEASURE DISTORTION COMPONENT" in FIG. 14). If third-order vector adjuster coefficient (amplitude value) dependence has not been found previously, a prespecified amplitude value $Y_{vec.t3}$ is used. If third-order vector adjuster dependence has been found previously, the phase value derived in the third-order vector adjuster coefficient (amplitude value) deriving process flow 1 is used. The power of the distortion component in the same sub-band as that in the third-order vector adjuster coefficient (phase value) calculating process is measured. Then the vector adjuster control part 181 records the set of measured distortion component power $D_{vec.0}$ and amplitude value $Y_{vec.t3}$ provided to the third-order vector adjuster 122 ("RECORD MEASURED VALUE" in FIG. 14). The vector adjuster control part 181 then determines whether or not the sequence from setting of amplitude value to recording of measured value has been repeated T3 times. If it is determined that the sequence has not been repeated T3 times, the process returns to the amplitude value setting, where the next amplitude value $Y_{vec.t3+1}$ is set in the third-order vector adjuster 122, then the sequence to the measured value recording is repeated. On the other hand, if it is determined that the sequence has been repeated T3 times, new coefficients $(b_2, b_1, b_0)$ of the quadratic function $(D_{vec.amp}=b_2 Y_{vec}^2+b_1 Y_{vec}+b_0)$ are found by the least square method ("FIND COEFFICIENTS $(b_2, b_1, b_0)$" in FIG. 14) and determination is made as to whether the coefficient $b_2$ is positive or not. If $b_2$ is positive, the amplitude value $Y_{vec.cal}=-b_1/2b_2$ that minimizes the quadratic function is calculated ("CALCULATE MINIMUM VALUE $(Y_{vec.cal}=-b_1/2b_2)$" in FIG. 14) and the amplitude value is set in the third-order vector adjuster 122 ("SET SELECTED AMPLITUDE VALUE" in FIG. 14). On the other hand, if $b_2$ is not positive, it is assumed that coefficients $(b_2, b_1, b_0)$ have not been found, an amplitude value that yielded the smallest distortion component is selected as $Y_{vec.cal}$ from among the amplitude values $Y_{vec.0}$, $Y_{vec.1}$ and $Y_{vec.2}$ set in the third-order vector adjuster 122 ("SELECT AMPLITUDE VALUE" in FIG. 14), and the selected amplitude value $Y_{vec.cal}$ is set in the third-order vector adjuster 122. If the ACLR obtained with $Y_{vec.cal}$ selected when $b_2$ is not positive is greater than or equal to the target value, the third-order vector adjuster coefficient (amplitude value) calculating process is performed anew (see FIG. 10). If this happens, $Y'_{vec.0}$ and $Y'_{vec.2}$ are calculated as $Y'_{vec.0}=Y_{vec.1}-\beta_{vec.0}|Y_{vec.0}-Y_{vec.1}|$ and $Y'_{vec.2}=Y_{vec.1}+\beta_{vec.2}|Y_{vec.2}-Y_{vec.1}|$, respectively, where $\beta_{vec.0}$ ($0<\beta_{vec.0}<1$) and $\beta_{vec.2}$ ($0<\beta_{vec.2}<1$) are prespecified offset values. Among the amplitude values $Y_{vec.0}$, $Y_{vec.1}$ and $Y_{vec.2}$, an amplitude value that yielded the smallest distortion component is obtained as $Y'_{vec.1}$. Then $Y'_{vec.0}$, $Y'_{vec.1}$ and $Y'_{vec.2}$ are set in the vector adjuster 122 when S2-2 is executed again.

While only third-order distortion components are compensated for in the first embodiment described above, one or more different Nth-order distortion generation paths, where N is an integer greater than or equal to 5, may be connected in parallel with the third-order distortion generating path. By arranging the Nth-order distortion generating paths in parallel, higher order distortion components can be compensated for. While phase values are calculated first and then amplitude values are calculated in the first embodiment, amplitude values may be calculated first and then phase values may be calculated if amplitude values are more sensitive to variations in distortion components than phase values because of characteristics of the power amplifier 13. A pilot signal generator and a switch, not shown, may be added to the input signal generator 30. The pilot signal generator generates a pilot signal used in calculating phase and amplitude values to be set in the third-order vector adjuster 122 for minimizing distortion components. The pilot signal may be a multitone signal containing two or more waves, a modulated signal such as a QPSK signal, or the same signal as an output signal of the transmission signal generator 31. The switch makes switching to allow a signal output from the pilot signal generator to be output from the input signal generator 30 while phase and amplitude values to be provided to the third-order vector adjuster 122 for minimizing a distortion component are being calculated. After completion of the calculations, the switch makes switching to allow a signal generated by the transmission signal generator 31 to be output from the input signal generator 30.

[First Variation]

The third-order vector adjuster coefficient (phase value) deriving process and the third-order vector adjuster coefficient (amplitude value) deriving process performed by the vector adjuster coefficient deriving part 182 in the first embodiment may be performed according to the process flows illustrated in FIGS. 16 and 17, respectively (hereinafter these process flows are referred to as the "third-order vector adjuster coefficient (phase value) deriving process flow 2" and the "third-order vector adjuster coefficient (amplitude value) deriving process flow 2", respectively). In this variation, a third-order vector adjuster coefficient (phase value) table in FIG. 18A is used to derive third-order vector adjuster coefficients (phase value) used for measuring distortion components and a third-order vector adjuster coefficient (amplitude value) table in FIG. 18B is used to derive third-order vector adjuster coefficients (amplitude values) used for measuring distortion components. The table in FIG. 18A contains offset values $\gamma_{vec.0}$ ($0<\gamma_{vec.0}\leq \frac{1}{2}\pi$) and $\gamma_{vec.1}$ ($0<\gamma_{vec.1}\leq \frac{1}{2}\pi$) associated with different values of $a_2$. The table in FIG. 18B contains offset values $\mu_{vec.0}$ ($0<\mu_{vec.0}$) and ($0<\mu_{vec.1}$) associated with different values of $b_2$. While four value ranges of $a_2$ and $b_2$ are provided and the value ranges are identical for $a_2$ and $b_2$ in the example in FIGS. 18A and 18B, any number of value ranges of $a_2$ and $b_2$ may be specified and the different value ranges of $a_2$ and $b_2$ may be different. An example of calculation of values of $\gamma_{vec.0}$ and $\gamma_{vec.1}$ used in the value ranges will be described below. The values of and $\mu_{vec.0}$ and $\mu_{vec.1}$ can be calculated in the same way. A function used for calculating $\gamma_{vec.0}$ and $\gamma_{vec.1}$ is defined as $g(z)=c_2 z^2+c_0$, where z is a valuable and $c_0$ is a distortion component. The offset values $\gamma_{vec.0}$ and $\gamma_{vec.1}$ are calculated as z:

$$z=\sqrt{((10^{0.1 L_{vec.phase}}-1)c_0/c_2)}$$

where $L_{vec.phase}$ (dB) is a difference in level for a distortion component $c_0$. Here, a value within the range of $a_2$ is specified for $c_2$ whereas any values may be specified for $c_0$ and $L_{vec.phase}$. It is assumed here that $c_0=1$ and $L_{vec.phase}=2$ dB. In the range $0<a_2\leq 1$, $\gamma_{vec.0}$ and $\gamma_{vec.1}$ are 1.1 when $c_2=0.5$. In the range of $1<a_2\leq 2$, $\gamma_{vec.0}$ and $\gamma_{vec.1}$ are 0.6 when $c_2=1.5$. In the range of $2<a_2\leq 3$, $\gamma_{vec.0}$ and $\gamma_{vec.1}$ are 0.5 when $c_2=2.5$. In the range of $3<a_2$, $\gamma_{vec.0}$ and $\gamma_{vec.1}$ are 0.4 when $c_2=4$. Alternatively, in order to change $\gamma_{vec.0}$ and $\gamma_{vec.1}$ according to the minimum value of a quadratic function found, $c_0$ may be set to the minimum value of the quadratic function found. In that case, $\gamma_{vec.0}$ and $\gamma_{vec.1}$ are updated each time a quadratic function is found. Alternatively, any values may be specified for $\gamma_{vec.0}$ and $\gamma_{vec.1}$ instead of using the exemplary calculation described above.

Flows of processes for deriving coefficients according to the first variation will be described below.

<Third-Order Vector Adjuster Coefficient (Phase Value) Deriving Process Flow 2>

FIG. 16 illustrates third-order vector adjuster coefficient (phase value) deriving process flow 2 (S1-2-2 in FIG. 10). The vector adjuster coefficient deriving part 182 refers to the third-order vector adjuster coefficient (phase value) table to obtain $\gamma_{vec.0}$ and $\gamma_{vec.1}$ associated with an already found value of $a_2$. The vector adjuster coefficient deriving part 182 uses $\gamma_{vec.0}$ and $\gamma_{vec.1}$ to calculate $X_{vec.1}$ ($=-a_1/2a_2$), $X_{vec.0}$ ($=X_{vec.1}-\gamma_{vec.0}$), and $X_{vec.2}$ ($=X_{vec.1}+\gamma_{vec.1}$) ("REFER TO THIRD-ORDER VECTOR ADJUSTER COEFFICIENT (PHASE VALUE) TABLE" in FIG. 16). The vector adjuster coefficient deriving part 182 provides the calculated $X_{vec.0}$, $X_{vec.1}$ and $X_{vec.2}$ to the vector adjuster control part 181 ("UPDATE THIRD-ORDER VECTOR ADJUSTER COEFFICIENTS (PHASE VALUES)" in FIG. 16) and ends the third-order vector adjuster coefficient (phase value) deriving process.

<Third-Order Vector Adjuster Coefficient (Amplitude Value) Deriving Process Flow 2>

FIG. 17 illustrates third-order vector adjuster coefficient (amplitude value) deriving process flow 2 (S1-4-2 in FIG. 10). The vector adjuster coefficient deriving part 182 refers to the third-order vector adjuster coefficient (amplitude value) table to obtain $\mu_{vec.0}$ and $\mu_{vec.1}$ associated with an already found value of $b_2$. The vector adjuster coefficient deriving part 182 uses $\mu_{vec.0}$ and $\mu_{vec.1}$ to calculate $Y_{vec.1}$ ($=-b_1/2b_2$), $Y_{vec.0}$ ($=Y_{vec.1}-\mu_{vec.0}$), and $Y_{vec.2}$ ($=Y_{vec.1}+\mu_{vec.1}$) ("REFER TO THIRD-ORDER VECTOR ADJUSTER COEFFICIENT (AMPLITUDE VALUE) TABLE" in FIG. 17). After completion of the calculation of $Y_{vec.0}$ and $V_{vec.2}$ the vector adjuster coefficient deriving part 182 determines whether $Y_{vec.0}>0$ or not. If $Y_{vec.0}>0$, the vector adjuster coefficient deriving part 182 directly provides the $Y_{vec.0}$, $Y_{vec.1}$ and $Y_{vec.2}$ to the vector adjuster control part 181 ("UPDATE THIRD-ORDER VECTOR ADJUSTER COEFFICIENTS (AMPLITUDE VALUES)" in FIG. 17) and ends the third-order vector adjuster coefficient (amplitude value) deriving process. On the other hand, if $Y_{vec.0}$ is less than or equal to 0, the vector adjuster coefficient deriving part 182 derives $Y_{vec.0}=\lambda_{vec.0}\cdot Y_{vec.1}$, where $\lambda_{vec.0}$ is a prespecified offset value in the range of $0<\lambda_{vec.0}<1$ ("RE-DERIVE THIRD-ORDER VECTOR ADJUSTER COEFFICIENT (AMPLITUDE VALUE)" in FIG. 17). The vector adjuster coefficient deriving part 182 provides $Y_{vec.0}$ thus obtained to the vector adjuster control part 181 together with $Y_{vec.1}$ and $Y_{vec.2}$.

[Second Variation]

The third-order vector adjuster coefficient (phase value) calculating process and the third-order vector adjuster coefficient (amplitude value) calculating process by the vector adjuster control part 181 in the first embodiment may be performed according to process flows illustrated in FIGS. 19 and 20, respectively (hereinafter these process flows are referred to as the "third-order vector adjuster coefficient (phase value) calculating process flow 2" and the "third-order vector adjuster coefficient (amplitude value) calculating process flow 2", respectively). In this variation, results of distortion component measurements measured using two different third-order vector adjuster coefficients are compared with each other and third-order vector adjuster coefficients are changed so that a third distortion component to be measured will be reduced. This method can calculate a third-order vector adjuster coefficient that minimizes a distortion component with a higher accuracy.

<Third-Order Vector Adjuster Coefficient (Phase Value) Calculating Process Flow 2>

FIG. 19 illustrates third-order vector adjuster coefficient (phase value) calculating process flow 2. In the third-order vector adjuster coefficient (phase value) calculating process flow 2, the sequence from phase value setting to measured value recording in third-order vector adjuster coefficient (phase value) calculating process flow 1 illustrated in FIG. 13 is performed. Once it is determined that the sequence has been repeated T2 times, the same coefficient finding step and the subsequent steps as in the process in FIG. 13 are performed. On the other hand, when it is determined that the sequence has not been repeated T2 times yet, the vector adjuster control part 181 determines whether the sequence from phase value setting to measured value recording has been performed twice. If the vector adjuster control part 181 determines that the sequence has not been performed twice, the vector adjuster control part 181 returns to the phase value setting and sets a phase value $X_{vec.1}$ in the third-order vector adjuster 122, then repeats the sequence from the phase value setting to the measured value recording. On the other hand, if the vector adjuster control part 181 determines that the sequence has been performed twice, the vector adjuster control part 181 calculates a comparative value $G_{vec}=10 \log_{10}(D_{vec.1}/D_{vec.0})$, which is defined as the difference between the distortion component level $D_{vec.0}$ measured for the first time around and the distortion component level $D_{vec.1}$ measured for the second time around ("CALCULATE COMPARATIVE VALUE" in FIG. 19). If $G_{vec}$ is greater than a prespecified threshold value, the vector adjuster control part 181 returns to the phase value setting and sets a phase value $X_{vec.2}$ in the third-order vector adjuster 122, then repeats the sequence to the measured value recording. If $G_{vec}$ is less than or equal to the threshold value, the vector adjuster control part 181 calculates the next phase value $X'_{vec.2}$ to be provided to the third-order vector adjuster 122 as $X'_{vec.2}=X_{vec.0}-|X_{vec.2}-X_{vec.1}|$ ("UPDATE PHASE VALUE FOR THIRD-ORDER VECTOR ADJUSTER" in FIG. 19), then returns to the phase value setting to set $X'_{vec.2}$ in the third-order vector adjuster 122, and repeats the sequence to the measured value recording.

<Third-Order Vector Adjuster Coefficient (Amplitude Value) Calculating Process Flow 2>

FIG. 20 illustrates third-order vector adjuster coefficient (amplitude value) calculating process flow 2. In the third-order vector adjuster coefficient (amplitude value) calculating process flow 2, the sequence from amplitude value setting to measured value recording in third-order vector adjuster coefficient (amplitude value) calculating process flow 1 illustrated in FIG. 14 is performed. Once it is determined that the sequence has been repeated T3 times, the same coefficient finding step and the subsequent steps as in the process in FIG. 14 are performed. On the other hand, when the vector adjuster control part 181 determines that the sequence has not been repeated T3 times, the vector adjuster control part 181 determines whether or not the sequence from amplitude value setting to measured value recording has been performed twice. If the vector adjuster control part 181 determines that the sequence has not been performed twice, the vector adjuster control part 181 returns to the amplitude value setting and sets an amplitude value $Y_{vec.1}$ in the third-order vector adjuster 122, then repeats the sequence from the amplitude value setting to the measured value recording. On the other hand, if the vector adjuster control part 181 determines that the sequence has been performed twice, the vector adjuster control part 181 calculates a comparative value $J_{vec}=10 \log_{10}(D_{vec.1}/D_{vec.0})$, which is defined as the difference between the distortion component level $D_{vec.0}$ measured for the first time around and the distortion component level $D_{vec.1}$ measured for the second time around ("CALCULATE COMPARATIVE VALUE" in FIG. 20). If $J_{vec}$ is greater than a prespecified threshold value, the vector adjuster control part 181 returns to the amplitude value setting and sets an amplitude value $Y_{vec.2}$ in the third-order vector adjuster 122, then repeats the sequence to the measured value recording. If $J_{vec}$ is less than or equal to the threshold value, the vector adjuster control part 181 calculates the next amplitude value $Y'_{vec.2}$ to be provided to the third-order vector adjuster 122 as $Y'_{vec.2}=\lambda_{vec.0} \cdot Y_{vec.0}$ (where $\lambda_{vec.0}$ is a preset offset value and $0<\lambda_{vec.0}<1$) ("UPDATE AMPLITUDE VALUE FOR THIRD-ORDER VECTOR ADJUSTER" in FIG. 20), then returns to the amplitude value setting to set $Y'_{vec.2}$ in the third-order vector adjuster 122, and repeats the sequence to the measured value recording.

[Second Embodiment]

In the first embodiment, the process in FIG. 10 is performed until an indicator of the value of a distortion component meets a prespecified condition. In a second embodiment, a process illustrated in FIG. 21 is performed. There are two differences between the first and second embodiments. First, in the determination as to whether third-order vector adjuster coefficient (phase value) dependence has been found, if it is determined that third-order vector adjuster coefficient (phase value) dependence has been found previously, a third-order vector adjuster coefficient (phase value) estimating process, which will be described, is performed; otherwise, a third-order vector adjuster coefficient (phase value) calculating process is performed. Second, in the determination in the first embodiment as to whether third-order vector adjuster coefficient (amplitude value) dependence has been found, if it is determined that third-order vector adjuster coefficient (amplitude value) dependence has been found previously, a third-order vector adjuster coefficient (amplitude value) estimating process, which will be described, is performed; otherwise, the same third-order vector adjuster coefficient (amplitude value) calculating process that is performed in the first embodiment is performed. These differences will be detailed below. The third-order vector adjuster coefficient (phase value) calculating process, the third-order vector adjuster coefficient (amplitude value) calculating process, and the ACLR indicator calculation and determination process in the process flow in FIG. 21 are the same as those in the first embodiment and therefore description of the processes will be omitted here.

First, determination is made as to whether dependence of a distortion component on a third-order vector adjuster coefficient (phase value) has been found previously or not. If third-order vector adjuster coefficient (phase value) dependence has been found previously, the vector adjuster coefficient deriving part 182 performs a third-order vector adjuster coefficient (phase value) estimating process, which will be described later, and then determines whether or not dependence of the distortion component on a third-order vector adjuster coefficient (amplitude value) has been found previously. On the other hand, if third-order vector adjuster coefficient (phase value) dependence has not been found previously, the vector adjuster coefficient deriving part 182 performs the third-order vector adjuster coefficient (phase value) calculating process and then determines whether or not dependence of the distortion component on a third-order vector adjuster coefficient (amplitude value) has been found previously. If third-order vector adjuster coefficient (amplitude value) dependence has been found previously, the vector adjuster coefficient deriving part 182 performs a third-order vector adjuster coefficient (amplitude value) estimating process, which will be described later. On the other hand, if third-order vector adjuster coefficient (amplitude value) dependence has not been found, the vector adjuster coefficient deriving part 182 performs the third-order vector adjuster coefficient (amplitude value) calculating process. After the third-order vector adjuster coefficient (amplitude value) calculating process or the third-order vector adjuster coefficient (amplitude value) estimating process, the vector adjuster coefficient deriving part 182 proceeds to the ACLR indicator calculation and determination process.

<Third-Order Vector Adjuster Coefficient (Phase Value) Estimating Process Flow>

FIG. 22 illustrates a third-order vector adjuster coefficient (phase value) estimating process flow.

First, the monitor 170 measures the level $D_{vec.1}$ of the distortion component under the third-order vector adjuster coefficient (phase value) $X_{vec.1}$ that is currently set in the vector adjuster 122 by the vector adjuster control part 181 ("MEASURE DISTORTION COMPONENT $D_{vec.1}$" in FIG. 22). Then the vector adjuster control part 181 records the level $D_{vec.1}$ of the distortion component together with $X_{vec.1}$ ("RECORD $D_{vec.1}$ AND $X_{vec.1}$" in FIG. 22). Then the vector adjuster coefficient deriving part 182 calculates $$X_{vec,0} = X_{vec,1} - \sqrt{(4a_2(D_{vec,1} - a_0) + a_1^2)/4a_2^2}$$

$$X_{vec,2} = X_{vec,1} + \sqrt{(4a_2(D_{vec,1} - a_0) + a_1^2)/4a_2^2}$$

and provides the calculated $X_{vec.0}$ and $X_{vec.2}$ to the vector adjuster control part 181 ("ESTIMATE PHASE VALUES $X_{vec.0}$ AND $X_{vec.2}$" in FIG. 22). The vector adjuster control part 181 sets the coefficient $X_{vec.0}$ provided to it in the third-order vector adjuster 122 ("SET PHASE VALUE $X_{vec.0}$" in FIG. 22). The monitor 170 measures the level $D_{vec.0}$ of the distortion component under this coefficient ("MEASURE DISTORTION COMPONENT $D_{vec.0}$" in FIG. 22). Then, the level $D_{vec.0}$ of the distortion component is recorded together with $X_{vec.0}$ ("RECORD $D_{vec.0}$ AND $X_{vec.0}$" in FIG. 22). Then, determination is made as to whether $D_{vec.0}$ is less than the distortion component minimum value $D_{vec.min}$ obtained the last time a third-order vector adjuster coefficient (phase value) for minimizing the distortion component was calculated plus a preset offset value $Q_{vec}$, that is, whether $D_{vec.0} < D_{vec.min} + Q_{vec}$, where $Q_{vec}$ is a preset offset value. If $D_{vec.0} < D_{vec.min} + Q_{vec}$, then $X_{vec.0}$ is assumed to be the third-order vector adjuster coefficient (phase value) that minimizes the distortion component, and then the third-order vector adjuster coefficient (phase value) estimating process will end. On the other hand, if $D_{vec.0}$ is not less than $D_{vec.min} + Q_{vec}$, the vector adjuster control part 181 sets a coefficient $X_{vec.2}$ in the third-order vector adjuster 122 ("SET PHASE VALUE $X_{vec.2}$" in FIG. 22) and the monitor 170 measures distortion component level $D_{vec.2}$ under the set coefficient ("MEASURE DISTORTION COMPONENT $D_{vec.2}$" in FIG. 22). Then the distortion component level $D_{vec.2}$ is recorded together with $X_{vec.2}$ ("RECORD $D_{vec.2}$ AND $X_{vec.2}$" in FIG. 22). Then determination is made as to whether $D_{vec.2} < D_{vec.min} + Q_{vec}$. If $D_{vec.2} < D_{vec.min} + Q_{vec}$, then $X_{vec.2}$ is assumed to be the third-order vector adjuster coefficient (phase value) that minimizes the distortion component, and then the third-order vector adjuster coefficient (phase value) estimating process will end. On the other hand, if $D_{vec2}$ is not less than $D_{vec.min} + Q_{vec}$, then new coefficients ($a_2$, $a_1$, $a_0$) of the quadratic function ($D_{vec.phase} = a_2 X_{vec}^2 + a_1 X_{vec} + a_0$) are found by the least square method from the recorded distortion components ($D_{vec.0}$, $D_{vec.1}$, $D_{vec.2}$) and the third-order vector adjuster coefficients (phase values) ($X_{vec.0}$, $X_{vec.1}$, $X_{vec.2}$) associated with these distortion components as in the first embodiment ("FIND COEFFICIENTS ($a_2$, $a_1$, $a_0$)" in FIG. 22) and determination is made as to whether coefficient $a_2$ is positive or not. If $a_2$ is positive, a phase value $X_{vec.cal} = -a_1/2a_2$ that minimizes the quadratic function is calculated ("CALCULATE MINIMUM VALUE ($X_{vec.cal} = -a_1/2a_2$)" in FIG. 22) and the phase value is set in the third-order vector adjuster 122 ("SET SELECTED PHASE VALUE" in FIG. 22). If $a_2$ is not positive, it is assumed that coefficients ($a_2$, $a_1$, $a_0$) have not been found and the phase value that yielded the smallest distortion component is selected as $X_{vec.cal}$ from among the phase values $X_{vec.0}$, $X_{vec.1}$ and $X_{vec.2}$ set in the third-order vector adjuster 122 ("SELECT PHASE VALUE" in FIG. 22). The selected phase value $X_{vec.cal}$ is set in the third-order vector adjuster 122. If ACLR obtained using $X_{vec.cal}$ selected when $a_2$ is not positive is greater than or equal to the target value, the third-order vector adjuster coefficient (phase value) calculating process is performed anew (See FIG. 21). In that case, $X'_{vec.0}$ and $X'_{vec.2}$ are calculated as $X'_{vec.0} = X_{vec.1} - \alpha_{vec.0}|X_{vec.0} - X_{vec.1}|$ and $X'_{vec.2} = X_{vec.1} + \alpha_{vec.2}|X_{vec.2} - X_{vec.1}|$, respectively, where $\alpha_{vec.0}$ ($0 < \alpha_{vec.0} < 1$) and $\alpha_{vec.2}$ ($0 < \alpha_{vec.2} < 1$) are preset offset values. In addition, the phase value that yielded the smallest distortion component is selected as $X'_{vec.1}$ from among the phase values $X_{vec.0}$, $X_{vec.1}$ and $X_{vec.2}$ set in the third-order vector adjuster 122. Then $X'_{vec.0}$, $X'_{vec.1}$ and $X'_{vec.2}$ are set in the vector adjuster 122 when THIRD-ORDER VECTOR ADJUSTER COEFFICIENT (PHASE VALUE) ESTIMATING PROCESS is executed again.

<Third-Order Vector Adjuster Coefficient (Amplitude Value) Estimating Process Flow>

FIG. 23 illustrates a third-order vector adjuster coefficient (amplitude value) estimating process flow.

First, the monitor 170 measures the level $D_{vec.1}$ of the distortion component under the third-order vector adjuster coefficient (amplitude value) $Y_{vec.1}$ that is currently set in the vector adjuster 122 by the vector adjuster control part 181 ("MEASURE DISTORTION COMPONENT $D_{vec.1}$" in FIG. 23). Then the vector adjuster control part 181 records the level $D_{vec.1}$ of the measured distortion component together with $Y_{vec.1}$ ("RECORD $D_{vec.1}$ AND $Y_{vec.1}$" in FIG. 23). Then the vector adjuster coefficient deriving part 182 calculates $$Y_{vec,0} = Y_{vec,1} - \sqrt{(4b_2(D_{vec,1} - b_0) + b_1^2)/4b_2^2}$$

$$Y_{vec,2} = Y_{vec,1} + \sqrt{(4b_2(D_{vec,1} - b_0) + b_1^2)/4b_2^2}$$

and provides the calculated $Y_{vec.0}$ and $Y_{vec.2}$ to the vector adjuster control part 181 ("ESTIMATE AMPLITUDE UES AND VALUES $Y_{vec.0}$ AND $Y_{vec.2}$" in FIG. 23). The vector adjuster control part 181 sets the coefficient $Y_{vec.0}$ provided to it in the third-order vector adjuster 122 ("SET AMPLITUDE VALUE $Y_{vec.0}$" in FIG. 23). The monitor 170 measures the level $D_{vec.0}$ of the distortion component under this coefficient ("MEASURE DISTORTION COMPONENT $D_{vec.0}$" in FIG. 23). Then, the measured level $D_{vec.0}$ of the distortion component is recorded together with $Y_{vec.0}$ ("RECORD $D_{vec.0}$ AND $Y_{vec.0}$" in FIG. 23). Then, determination is made as to whether $D_{vec.0}$ is less than the distortion component minimum value $D_{vec.min}$ obtained the last time the third-order vector adjuster coefficient (amplitude value) for minimizing the distortion component was calculated plus a preset offset value $R_{vec}$, that is, whether $D_{vec.0} < D_{vec.min} + R_{vec}$. If $D_{vec.0} < D_{vec.min} + R_{vec}$, then $Y_{vec.0}$ is assumed to be the third-order vector adjuster coefficient (amplitude value) that minimizes the distortion component, and then the third-order vector adjuster coefficient (amplitude value) estimating process will end. On the other hand, if $D_{vec.0}$ is not less than $D_{vec.min} + R_{vec}$, the vector adjuster control part 181 sets a coefficient $Y_{vec.2}$ in the third-order vector adjuster 122 ("SET AMPLITUDE VALUE $Y_{vec.2}$" in FIG. 23) and the monitor 170 measures the distortion component level $D_{vec.2}$ under the set coefficient ("MEASURE DISTORTION COMPONENT $D_{vec.2}$" in FIG. 23). The distortion component level $D_{vec.2}$ is recorded together with $Y_{vec.2}$ ("RECORD $D_{vec.2}$ AND $Y_{vec.2}$" in FIG. 23). Then determination is made as to whether $D_{vec.2} < D_{vec.min} R_{vec}$. If $D_{vec.2} < D_{vec.min} R_{vec}$, then $Y_{vec.2}$ is assumed to be the third-order vector adjuster coefficient (amplitude value) that minimizes the distortion component and the third-order vector adjuster coefficient (amplitude value) estimating process will end. On the other hand, if $D_{vec.2}$ is not less than $D_{vec.min} + R_{vec}$, then new coefficients ($b_2$, $b_1$, $b_0$) of the quadratic function ($D_{vec.amp} = b_2 Y_{vec}^2 + b_1 Y_{vec} + b_0$) are found by the least square method from the recorded distortion components ($D_{vec.0}$, $D_{vec.1}$, $D_{vec.2}$) and the third-order vector adjuster coefficients (amplitude values) ($Y_{vec.0}$, $Y_{vec.1}$, $Y_{vec.2}$) associated with these distortion components as in the first embodiment ("FIND COEFFICIENTS ($b_2$, $b_1$, $b_0$)" in FIG. 23) and determination is made as to whether coefficient $b_2$ is positive or not. If $b_2$ is positive, an amplitude value $Y_{vec.cal} = -b_1/2b_2$ that minimizes the quadratic function is calculated ("CALCULATE MINIMUM VALUE ($Y_{vec.cal} = -b_1/2b_2$)" in FIG. 23) and is set in the third-order vector adjuster 122 ("SET SELECTED AMPLITUDE VALUE" in FIG. 23). If $b_2$ is not positive, it is assumed that coefficients ($b_2$, $b_1$, $b_0$) have not been found and the amplitude value that yielded the smallest distortion component is selected as $Y_{vec.cal}$ from among the amplitude values $Y_{vec.0}$, $Y_{vec.1}$ and $Y_{vec.2}$ set in the third-order vector adjuster 122 ("SELECT AMPLITUDE VALUE" in FIG. 23). The selected amplitude value $Y_{vec.cal}$ is set in the third-order vector adjuster 122. If ACLR obtained using $Y_{vec.cal}$ selected when $b_2$ is not positive is greater than or equal to the target value, the third-order vector adjuster coefficient (amplitude value) calculating process is performed anew (See FIG. 21). In that case, $Y'_{vec.0}$ and $Y'_{vec.2}$ are calculated as $Y'_{vec.0} = Y_{vec.1} - \beta_{vec.0}|Y_{vec.0} - Y_{vec.1}|$ and $Y'_{vec.2} = Y_{vec.1} + \beta_{vec.2}|Y_{vec.2} - Y_{vec.1}|$, respectively, where $\beta_{vec.0} (0 < \beta_{vec.0} < 1)$ and $\beta_{vec.2} (0 < \beta_{vec.2} < 1)$ are preset offset values. In addition, the amplitude value that yielded the smallest distortion component is selected as $Y'_{vec.1}$ from among the amplitude values $Y_{vec.0}$, $Y_{vec.1}$ and $Y_{vec.2}$ set in the third-order vector adjuster 122. Then $Y'_{vec.0}$, $Y'_{vec.1}$ and $Y'_{vec.2}$ are set in the vector adjuster 122 when THIRD-ORDER VECTOR ADJUSTER COEFFICIENT (AMPLITUDE VALUE) ESTIMATING PROCESS is executed again.

[Third Embodiment]

FIG. 24 illustrates a power series digital predistorter 200 according to the present invention and its peripheral devices. The peripheral devices here are an amplifier 10, a feedback signal generator 20, and an input signal generator 30, as in the power series digital predistorter 100. The configuration of the power series digital predistorter 200 differs from that of the power series digital predistorter 100 of the first embodiment illustrated in FIG. 9 in that an Nth-order frequency characteristic compensator 223 illustrated in FIG. 25 is added after the Nth-order vector adjuster 122 in the Nth-order distortion generating path 120 and a frequency characteristic compensator control part 283 and a frequency characteristic compensator coefficient deriving part 284 are added to the controller 180.

Figure 3:
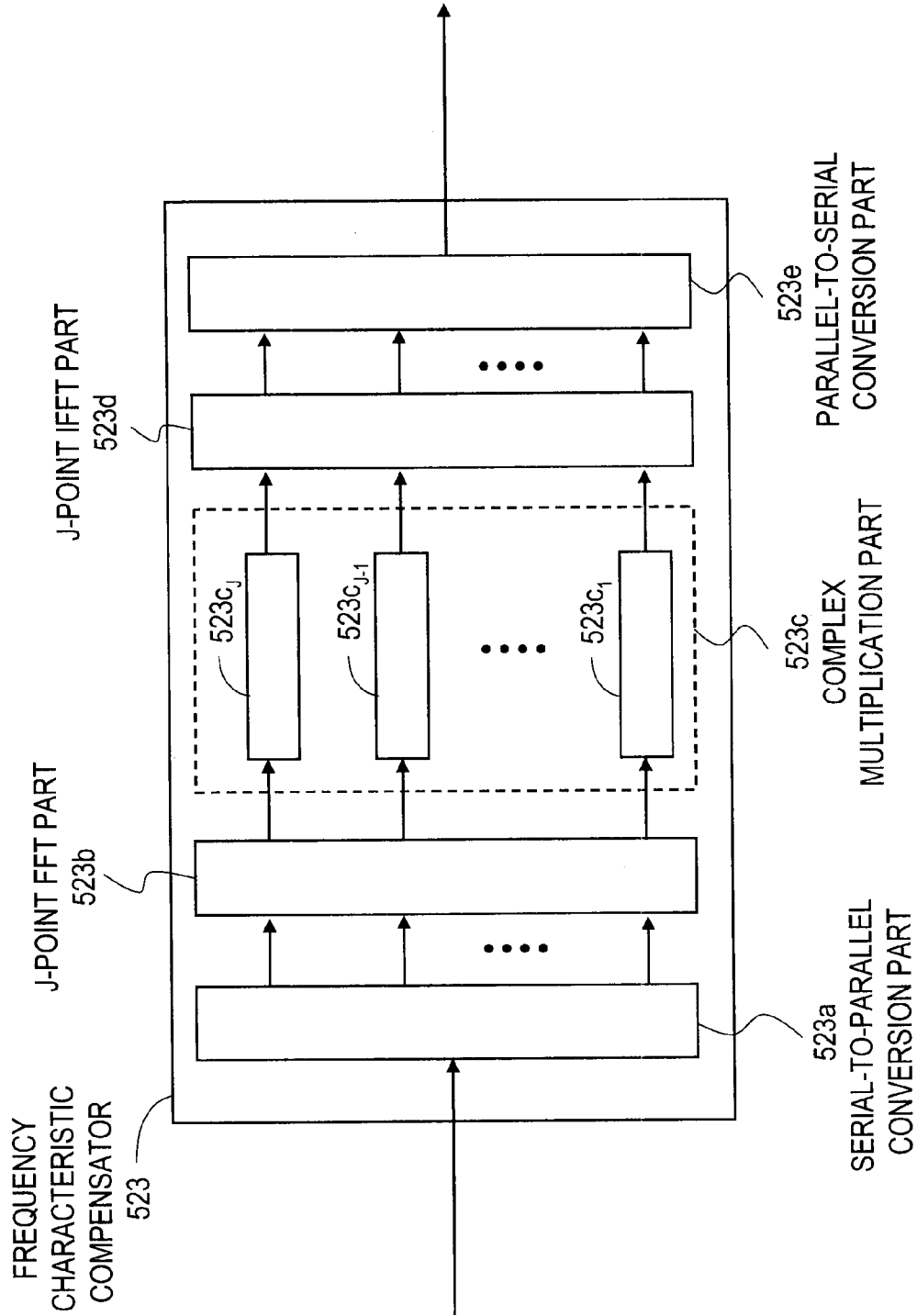
FIG. 3 is a block diagram illustrating an exemplary configuration of a conventional frequency characteristic compensator.
Figure 4:
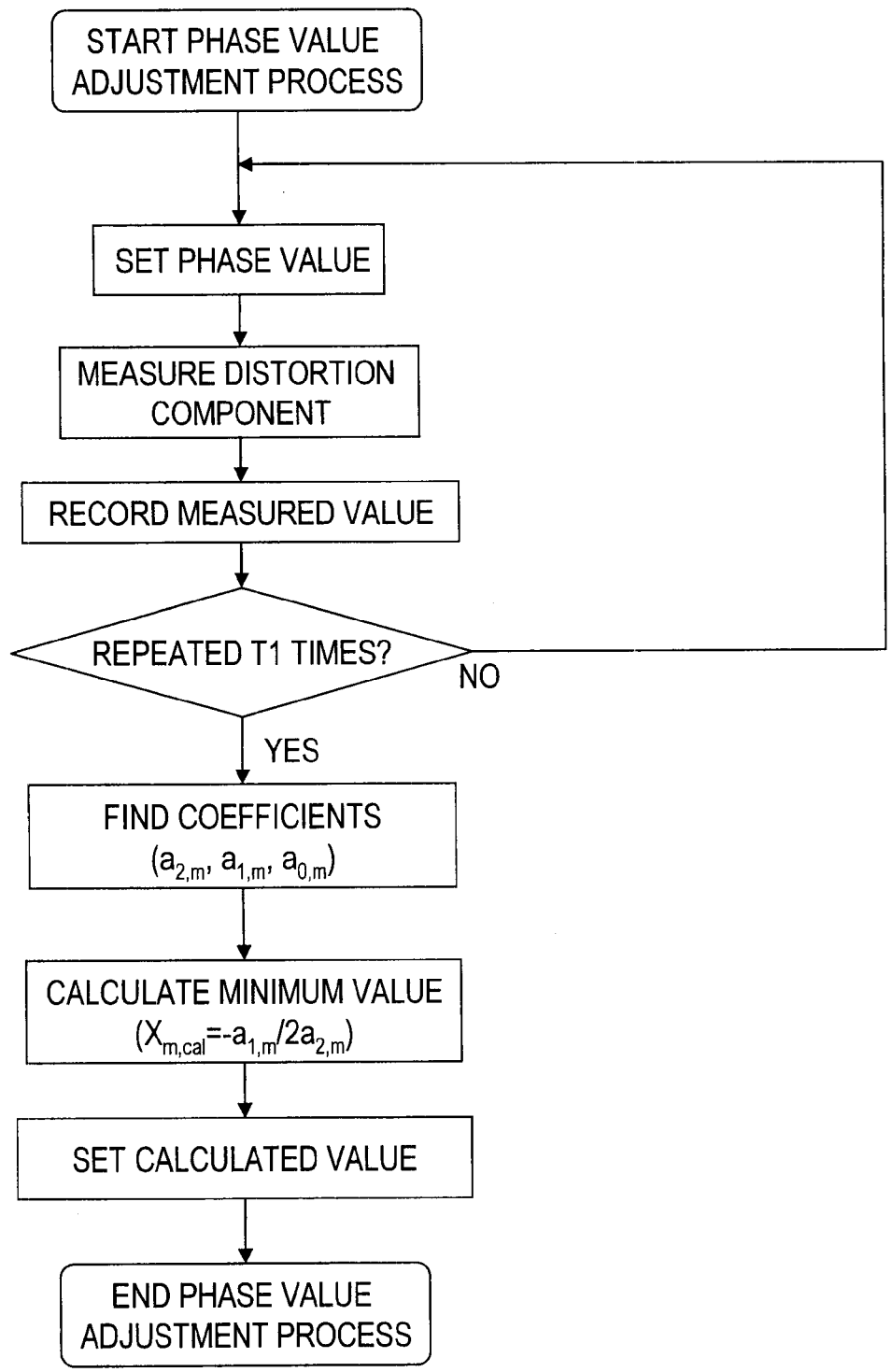
FIG. 4 is a flowchart of a process for calculating a frequency characteristic compensator coefficient (phase value)

The Nth-order frequency characteristic compensator 223 multiplies Nth-order distortion component upper sub-bands and Nth-order distortion component lower sub-bands, in total M sub-bands, as illustrated in FIG. 2, by different Nth-order frequency characteristic compensator coefficients, respectively. FIG. 25 illustrates an exemplary configuration of the Nth-order frequency characteristic compensator 223. The Nth-order frequency characteristic compensator 223 includes a serial-to-parallel conversion part 223a, a J-point FFT part 223b, J M) complex multiplication parts $223c_j$ (where j is an integer in the range of 1 to J), a J-point IFFT part 223d, and a parallel-to-serial conversion part 223e. The Nth-order frequency characteristic compensator 223 has the same configuration as the third-order frequency characteristic compensator 523 illustrated in FIG. 3 and therefore description of the components will be omitted.

The frequency characteristic compensator control part 283 includes five functions. A first function is to provide a plurality of Nth-order frequency characteristic compensator coefficients used for measuring a distortion component of each of sub-bands and an Nth-order frequency characteristic compensator coefficient for minimizing the distortion component to each complex multiplication part 223c, of the Nth-order frequency characteristic compensator 223. A second function is to record, for each of the sub-bands, a plurality of Nth-order frequency characteristic compensator coefficients for measuring distortion components and the results of measurement of the distortion components obtained from a monitor 170 when the coefficients were applied to the Nth-order frequency characteristic compensator 223. A third function is to find dependence of the distortion component of each sub-band on an Nth-order frequency characteristic compensator coefficient from the results of measurement of the plurality of measured distortion components recorded by the second function. A fourth function is to calculate an Nth-order frequency characteristic compensator coefficient that minimizes the distortion component from the Nth-order frequency characteristic compensator coefficient dependence found by the third function for each sub-band. A fifth function is to determine whether or not an indicator indicating the value of the distortion component meets a prespecified condition (for example whether or not the indicator is less than or equal to a target value) and if not, to calculate an Nth-order frequency characteristic compensator coefficient that minimizes the distortion component anew.

The frequency characteristic compensator coefficient deriving part 284 includes two functions. A first function is to derive a plurality of Nth-order frequency characteristic compensator coefficients to be set in the Nth-order frequency characteristic compensator 223 by the frequency characteristic compensator control part 283 for measuring a distortion component of each sub-band on the basis of previously found Nth-order frequency characteristic compensator coefficient dependence, if any, when the frequency characteristic compensator control part 283 attempts to find dependence of a distortion component in each of sub-bands on an Nth-order frequency characteristic compensator coefficient. A second function is to provide the plurality of Nth-order frequency characteristic compensator coefficients for measuring a distortion component of each sub-band derived by the first function to the frequency characteristic compensator control part 283.

A flow of process of determining that the indicator of the value of a distortion component meets a prespecified condition will be described with reference to FIG. 26. The indicator indicating the value of a distortion component is ACLR as in the first embodiment. For convenience, the process will be described with respect to an example in which N=3, that is, the Nth-order distortion generating path 120 is a third-order distortion generating path. If a fifth- or higher-order distortion generating path is added, an Nth-order frequency characteristic compensator associated with the distortion generating path may be added as needed.

First, the process is performed according to the process flow illustrated in FIG. 10. If the ACLR of at least one of the upper and lower bands is not reduced below a target value after the sequence from S1-1 to S3 is repeated a predetermined number of times, the process in FIG. 10 is exited (S4) to enter a frequency characteristic compensator coefficient calculating process illustrated in FIG. 26 (from connector A in FIG. 10 to connector A in FIG. 26).

<Frequency Characteristic Compensator Coefficient Calculating Process Flow>

The frequency characteristic compensator control part 283 specifies a sub-band calculating a third-order frequency characteristic compensator coefficient. The third-order frequency characteristic compensator coefficient calculation is performed on all sub-bands in a prespecified order on a sub-band-by-sub-band basis. First, any one of sub-bands, m, is specified in the step of specifying a band of third-order frequency characteristic compensator coefficient (S5). Then, the frequency characteristic compensator coefficient deriving part 284 determines whether or not dependence of a distortion component in the sub-band m on third-order frequency characteristic compensator coefficient (phase value) has been found previously (S6-1). If third-order frequency characteristic compensator coefficient (phase value) dependence has been found previously, a third-order frequency characteristic compensator coefficient (phase value) deriving process (S6-2) is performed for the sub-band m in the same way as in the third-order vector adjuster coefficient (phase value) deriving process described earlier. Lookup tables like those illustrated in FIGS. 15 and 18 can be used to derive coefficients in the third-order frequency characteristic compensator coefficient (phase value) deriving process in the same way as in the first embodiment or the first variation. Then determination is made as to whether dependence of a distortion component in the sub-band m on a third-order frequency characteristic compensator coefficient (amplitude value) has been found previously (S6-3). If third-order frequency characteristic compensator coefficient (phase value) dependence has not been found previously, the third-order frequency characteristic compensator coefficient (phase value) deriving process for the sub-band m is not performed. Instead, determination is made as to whether dependence of the distortion component in the sub-band m on a third-order frequency characteristic compensator coefficient (amplitude value) has been found previously (S6-3). If third-order frequency characteristic compensator coefficient (amplitude value) dependence has been found previously, a third-order frequency characteristic compensator coefficient (amplitude value) deriving process (S6-4) is performed on the sub-band m in the same way as in the third-order vector adjuster coefficient (amplitude value) deriving process described earlier. Lookup tables like those illustrated in FIGS. 15 and 18 can be used to derive coefficients in the third-order frequency characteristic compensator coefficient (amplitude value) deriving process in the same way as in the first embodiment or the first variation. Then the frequency characteristic compensator control part 283 performs a third-order frequency characteristic compensator coefficient (phase value) calculating process for the sub-band m (S7-1). On the other hand, if third-order frequency characteristic compensator coefficient (amplitude value) dependence has not been found previously, the third-order frequency characteristic compensator coefficient (amplitude value) deriving process is not performed for the sub-band m. Instead, the third-order frequency characteristic compensator coefficient (phase value) calculating process (S7-1) is performed in the frequency characteristic compensator control part 283. The third-order frequency characteristic compensator coefficient (phase value) calculating process for the sub-band m is performed in the same way as in the third-order vector adjuster coefficient (phase value) calculating process described earlier. Then a third-order frequency characteristic compensator coefficient (amplitude value) calculating process (S7-2) is performed for the sub-band m in the same way as in the third-order vector adjuster coefficient (amplitude value) calculating process described earlier. In S7-1 and S7-2, the monitor 170 measures the power of the distortion component in each sub-band m. After completion of the third-order frequency characteristic compensator coefficient (amplitude value) calculating process for the sub-band m, the frequency characteristic compensator control part 283 performs ACLR indicator calculation and determination. If the calculated ACLR is less than the target value, the third-order frequency characteristic compensator coefficient calculating process will end (S8). If the ACLR is greater than or equal to the target value, determination is made as to whether third-order frequency characteristic compensator coefficients have been calculated for all sub-bands (S9). If it is determined that there is an additional sub-band for which the third-order frequency characteristic compensator coefficient is to be calculated, the process returns to specifying a band of the third-order frequency characteristic compensator coefficient (S5). If it is determined that third-order frequency characteristic compensator coefficients for all sub-bands have been calculated, determination is made as to whether calculation of third-order frequency characteristic compensator coefficients for all sub-bands have been repeated a specified number of times (S10).

While the third-order frequency characteristic compensator coefficient (phase value) calculating process is performed first and then the third-order frequency characteristic compensator coefficient (amplitude value) calculation process is performed in this embodiment, the order may be changed depending on the characteristics of the power amplifier. Furthermore, instead of the third-order frequency characteristic compensator coefficient (phase value) deriving process, a third-order frequency characteristic compensator coefficient (phase value) estimating process may be performed in the same ways as in the third-order vector adjuster coefficient (phase value) estimating process described in the second embodiment. In that case, the third-order frequency characteristic compensator coefficient (phase value) calculating process is performed only when it is determined in the determination at S6-1 that third-order frequency characteristic compensator coefficient (phase value) dependence has not been found previously. Similarly, instead of the third-order frequency characteristic compensator coefficient (amplitude value) deriving process, a third-order frequency characteristic compensator coefficient (amplitude value) estimating process may be performed in the same ways as in the third-order vector adjuster coefficient (amplitude value) estimating process described in the second embodiment. In that case, the third-order frequency characteristic compensator coefficient (amplitude value) calculating process is performed only when it is determined in the determination at S6-3 that third-order frequency characteristic compensator coefficient (amplitude value) dependence has not been found previously. In this embodiment, phase and amplitude values that minimize a distortion component in a sub-band m are calculated and then phase and amplitude values that minimize a distortion component in another sub-band are calculated. However, depending on the characteristics of the power amplifier 13, phase values that minimize distortion components in all sub-bands may be calculated on a sub-band-by-sub-band basis and then amplitude values that minimize distortion components for all the sub-bands may be calculated on a sub-band-by-sub-band basis. In that case, which of phase and amplitude is calculated first may be determined according to the characteristics of the power amplifier 13. While phase and amplitude values that minimize distortion components in sub-bands are calculated in sequence on a sub-band-by-sub-band basis in the embodiment, the phase and amplitude values for a plurality of sub-bands (such as all sub-bands or two sub-bands, for example) may be calculated concurrently. In that case, the monitor 170 concurrently measures distortion components in the sub-bands, the frequency characteristic compensator control part 283 concurrently calculates third-order frequency characteristic compensator coefficient that minimize distortion components in each sub-band, and the frequency characteristic compensator coefficient deriving part 284 concurrently derives a plurality of third-order frequency characteristic compensator coefficients used when the frequency characteristic compensator control part 283 calculates third-order frequency characteristic compensator coefficient that minimize the distortion components in each sub-band. While third-order vector adjuster coefficients that minimize distortion components are updated first and then third-order frequency characteristic compensator coefficients are updated in the embodiment, only the third-order frequency characteristic compensator coefficients may be updated without updating third-order vector adjuster coefficients.

A pilot signal generator and a switch, not shown, may be added to the input signal generator 30 of the embodiment. The pilot signal generator generates a pilot signal used in calculations of phase and amplitude values to be set in the third-order vector adjuster 122 and calculations of phase and amplitude values to be provided to the third-order frequency characteristic compensator 223 for minimizing distortion components. The pilot signal may be a multitone signal containing two or more waves, a modulated signal such as a QPSK signal, or the same signal as an output signal of the transmission signal generator 31. If the number of waves of a multitone signal used as the pilot signal is greater than or equal to M, third-order frequency characteristic compensator coefficients for sub-bands may be calculated with a fixed frequency spacing of the multitone signal. On the other hand, if the number of waves of a multitone signal used as the pilot signal is less than M, third-order frequency characteristic compensator coefficients are calculated with varying frequency spacings of the multitone signal for different sub-bands. A distortion component is generated in each sub-band by changing the frequency spacing of the multitone signal. The switch makes switching to allow a signal output from the pilot signal generator to be output from the input signal generator 30 while phase and amplitude values to be provided to the third-order vector adjuster 122 and phase and amplitude values to be provided to the third-order frequency characteristic compensator 223 for minimizing distortion components are being calculated. After completion of the calculations, the switch makes switching to allow a signal generated by the transmission signal generator 31 to be output from the input signal generator 30.

[Experimental Result]

FIG. 27 shows the results of an experiment on the third embodiment. A 2-GHz band, 1 W amplifier (with an output backoff of 12.5 dB) was used in the experiment. For the third-order frequency characteristic compensator 223, each of the distortion component upper and lower bands is evenly divided into two (M=4) to provide four sub-bands. They are labeled 1, 2, 3 and 4 in ascending order of frequency.

In the experiment, 10 third-order frequency characteristic compensator coefficients (phase values and amplitude values) were measured at even intervals to obtain $f_{1.phase}$ and $f_{1.amp}$ (Y). About an hour later, 10 third-order frequency characteristic compensator coefficients were measured at even intervals to obtain $f_{2.phase}$ (X) and $f_{2.amp}$(Y). An identical third-order vector coefficient was used in both measurements. The difference between a third-order frequency characteristic compensator coefficient (phase value) $X_{min}$ minimizing a distortion component obtained from $f_{2.phase}$ (X) and a phase value $X_{cal}$ calculated based on $f_{1.phase}$ (X) by a conventional method was calculated. Also, the difference between the coefficient $X_{min}$ and a phase value $X_{cal}$ calculated based on $f_{1.phase}$ (X) by the method of the present invention was calculated. Furthermore, the difference between a third-order frequency characteristic compensator coefficient (amplitude value) $Y_{min}$ minimizing the distortion component obtained from $f_{2.amp}$ (Y) and an amplitude value $Y_{cal}$ calculated based on $f_{1.amp}$ (Y) by the conventional method was calculated. Also, the difference between the coefficient $Y_{min}$ and an amplitude value $Y_{cal}$ calculated based on $f_{1.amp}$ (Y) by the method of the present invention was calculated. The third-order frequency characteristic compensator coefficient (phase value) minimizing $f_{1.phase}$ (X) was set as $X_1$ and the third-order frequency characteristic compensator coefficient (amplitude values) minimizing $f_{1.amp}$ (Y) was set as $Y_1$. In the conventional method, $\Delta X$ (for phase values) was set to 0.42 and $\Delta Y$ (for amplitude value) was set to 0.13. In the method of the present invention, offset values $P_{m.phase}$ and $P_{m.amp}$ were set to 1.5 dB, and $X_0$ and $X_2$ and $Y_0$ and $Y_2$ were derived. The conventional method and the method of the present invention were used to calculate evaluation functions of the phase and amplitude values (for phase value, $e=100*|X_{min}-X_{cal}|/X_{min}$; for amplitude value, $e=100*|Y_{min}-Y_{cal}|/Y_{min}$) for the four sub-bands. The result of the calculations are shown in FIG. 27. The black bars represent the results obtained by the conventional method and the hatched bars represent the results obtained by the method of the present invention. In sub-band 1, e of the phase value obtained by the conventional method is 20.2%, whereas e of the phase value obtained by the method of the present invention is 10.0%, which shows an improvement of 10.2%. In sub-bands 2 and 3, e of the phase values obtained by the method of the present invention and the conventional method are the same. For the other phase and amplitude values, the method of the present invention generally shows improvement of e over the conventional method. It can be seen from the foregoing that the method of the present invention in which offset values are given in a previously found quadratic function and third-order frequency characteristic compensator coefficients used for distortion component measurement are selected based on the quadratic function can calculate values closer to third-order frequency characteristic compensator coefficients that actually minimize distortion components than those calculated by the conventional method.

What is claimed is:

1. A power series digital predistorter comprising:
 a linear transmission path delaying and transmitting an input signal;

a distortion generating path comprising an Nth-order distortion generator generating an Nth-order distortion component of the input signal and an Nth-order vector adjuster adjusting the phase and amplitude of the Nth-order distortion component, where N being an odd number greater than or equal to 3, the distortion generating path outputting an output of the Nth-order vector adjuster as a distortion compensation component;

a combiner combining the input signal output from the linear transmission path with the distortion compensation component output from the distortion generating path;

a monitor measuring a distortion component of each of predetermined frequency bands contained in an output of a power amplifier amplifying the power of an output of the combiner; and a controller calculating an amount of adjustment of the phase of an Nth-order distortion component and an amount of adjustment of the amplitude of the Nth-order distortion component and setting the calculated amounts of adjustment in the Nth-order vector adjuster, the amounts of adjustment being used for generating the distortion compensation component cancelling the distortion component contained in the output of the power amplifier measured by the monitor;

wherein the controller comprises:

a vector adjuster control part which sets in the Nth-order vector adjuster a plurality of phase values and a plurality of amplitude values which are used for measuring a distortion component, finds dependence of a distortion component contained in an output of the power amplifier on a phase value set in the Nth-order vector adjuster and on an amplitude value set in the Nth-order vector adjustor from a plurality of distortion component measurements each obtained by the monitor under each of the plurality of set phase values and from a plurality of distortion component measurements each obtained under each of the plurality of set amplitude values, calculates a phase value and an amplitude value that cancel the distortion component contained in the output of the power amplifier from the found dependences, and sets the calculated phase value and amplitude value in the Nth-order vector adjuster; and a vector adjuster coefficient deriving part which, when the vector adjuster control part finds dependence of a distortion component contained in an output of the power amplifier on a phase value set in the Nth-order vector adjuster and on an amplitude value set in the Nth-order vector adjuster, derives a plurality of phase values and a plurality of amplitude values used for measuring the distortion component contained in the output of the power amplifier from previously found dependence of the distortion component on a phase value and on an amplitude value, respectively, set in the Nth-order vector adjuster, and provides the plurality of phase values and the plurality of amplitude values to the vector adjuster control part.

2. The power series digital predistorter according to claim 1, wherein:

the distortion generating path further comprises an Nth-order frequency characteristic compensator which converts an output of the Nth-order vector adjustor from a time domain to a frequency domain, divides the frequency band of the output of the Nth-order vector adjuster into M sub-bands in the frequency domain, adjusts the phase and amplitude of each of sub-bands and then converts the output from the frequency domain to the time domain, where M being an integer greater than or equal to 2;

the distortion generating path outputs an output of the Nth-order frequency characteristic compensator as the distortion compensation component; and the controller comprises:

a frequency characteristic compensator control part which sets in the Nth-order frequency characteristic compensator a plurality of phase values and a plurality of amplitude values used for measuring a distortion component in each of the sub-bands, finds dependence of the distortion component in the sub-band contained in the output of the power amplifier on a phase value set in the Nth-order frequency characteristic compensator and on an amplitude value set in the Nth-order frequency characteristic compensator from a plurality of distortion component measurements each obtained by the monitor under each of the plurality of set phase values and from a plurality of distortion component measurements each obtained by the monitor under each of the set plurality of amplitude values, calculates a phase value and an amplitude value that cancel the distortion component in each sub-band contained in the output of the power amplifier from the found dependencies, and sets the calculated phase value and amplitude value in the Nth-order frequency characteristic compensator; and a frequency characteristic compensator coefficient deriving part which, when the frequency characteristic compensator control part finds dependence of a distortion component in the sub-band contained in an output of the power amplifier on a phase value set in the Nth-order frequency characteristic compensator and on an amplitude value set in the Nth-order frequency characteristic compensator, derives a plurality of phase values and a plurality of amplitude values used for measuring the distortion component in the sub-band contained in the output of the power amplifier from previously found dependence of the distortion component in the sub-band contained in the output of the power amplifier on a phase value and on an amplitude value set in the Nth-order frequency characteristic compensator, and provides the plurality of phase values and the plurality of amplitude values to the frequency characteristic compensator control part.

3. A distortion compensation control method for a power series digital predistorter comprising:

a linear transmission path delaying and transmitting an input signal;

a distortion generating path comprising an Nth-order distortion generator generating an Nth-order distortion component of the input signal and an Nth-order vector adjuster adjusting the phase and amplitude of the Nth-order distortion component, where N being an odd number greater than or equal to 3, the distortion generating path outputting an output of the Nth-order vector adjuster as a distortion compensation component;

a combiner combining the input signal output from the linear transmission path with the distortion compensation component output from the distortion generating path;

a monitor measuring a distortion component of each of predetermined frequency bands contained in an output of a power amplifier amplifying the power of an output of the combiner; and a controller calculating an amount of adjustment of the phase of an Nth-order distortion component and an amount of adjustment of the amplitude of the Nth-order distortion component and setting the calculated amounts of adjustment in the Nth-order vector adjuster, the amounts of adjustment being used for generating the distortion compensation component cancelling the distortion component contained in the output of the power amplifier measured by the monitor;

wherein the method comprises:

a vector adjuster coefficient deriving step of deriving a plurality of phase values and a plurality of amplitude values used for measuring a distortion component contained in an output of the power amplifier from previously found dependence of the distortion component on a phase value and on an amplitude value set in the Nth-order vector adjuster;

a vector adjuster setting step of setting in the Nth-order vector adjuster the plurality of phase values and the plurality of amplitude values derived in the vector adjuster coefficient deriving step, newly finding dependence of a distortion component contained in an output of the power amplifier on a phase value and on an amplitude value set in the Nth-order vector adjuster from a plurality of distortion component measurements each obtained by the monitor under each of the plurality of set phase values and from a plurality of distortion component measurements each obtained by the monitor under each of the plurality of set amplitude values, calculating a phase value and an amplitude value that cancel the distortion component contained in the output of the power amplifier from the newly found dependences, and setting the calculated phase value and amplitude value in the Nth-order vector adjustor;

a determination step of determining whether or not an indicator indicating that a distortion component produced in the power amplifier has been canceled satisfies a predetermined condition and, if the indicator satisfies the condition, terminating the sequence of the vector adjuster coefficient deriving step and the vector adjuster setting step; and a repetition control step of, if the indicator does not satisfy the condition, terminating the sequence of the vector adjuster coefficient deriving step and the vector adjuster setting step when the sequence of the vector adjuster coefficient deriving step and the vector adjuster setting step has been repeated a predetermined number of times, and performing control to cause the sequence of the vector adjuster coefficient deriving step and the vector adjuster setting step to be repeated when the sequence of the vector adjuster coefficient deriving step and the vector adjuster setting process has not been repeated the predetermined number of times.

4. A distortion compensation control method for a power series digital predistorter comprising:

a linear transmission path delaying and transmitting an input signal;

a distortion generating path comprising an Nth-order distortion generator generating an Nth-order distortion component of the input signal, where N being an odd number greater than or equal to 3, an Nth-order vector adjuster adjusting the phase and amplitude of the Nth-order distortion component, and an Nth-order frequency characteristic compensator which converts an output of the Nth-order vector adjustor from a time domain to a frequency domain, divides the frequency band of the output of the Nth-order vector adjuster into M sub-bands in the frequency domain, adjusts the phase and amplitude of each of sub-bands and then converts the output from the frequency domain to the time domain, where M being an integer greater than or equal to 2, wherein the distortion generating path outputs an output of the Nth-order frequency characteristic compensator as a distortion compensation component; and a combiner combining the input signal output from the linear transmission path with the distortion compensation component output from the distortion generating path;

a monitor measuring a distortion component of each of predetermined frequency bands contained in an output of a power amplifier amplifying the power of an output of the combiner;

a controller which calculates an amount of adjustment of the phase of an Nth-order distortion component and an amount of adjustment of the amplitude of the Nth-order distortion component for generating the distortion compensation component that cancels a distortion component contained in an output of the power amplifier measured by the monitor, sets the amounts of adjustment in the Nth-order vector adjuster, calculates a plurality of phase values and a plurality of amplitude values to be set in the Nth-order frequency characteristic compensator for generating the distortion compensation component that cancels a distortion component of the sub-band contained in an output of the power amplifier measured by the monitor, and sets the plurality of calculated phase values and the plurality of calculated amplitude values in the Nth-order frequency characteristic compensator;

wherein the method comprises:

a vector adjuster coefficient deriving step of deriving a plurality of phase values and a plurality of amplitude values used for measuring a distortion component contained in an output of the power amplifier from previously found dependence of the distortion component on a phase value and on an amplitude value set in the Nth-order vector adjuster;

a vector adjuster setting step of setting in the Nth-order vector adjuster the plurality of phase values and the plurality of amplitude values derived in the vector adjuster coefficient deriving step, newly finding dependence of a distortion component contained in an output of the power amplifier on a phase value and on an amplitude value set in the Nth-order vector adjuster from a plurality of distortion component measurements each obtained by the monitor under each of the plurality of set phase values and from a plurality of distortion component measurements each obtained by the monitor under each of the plurality of set amplitude values, calculating a phase value and an amplitude value that cancel the distortion component contained in the output of the power amplifier from the newly found dependencies, and setting the calculated phase value and amplitude value in the Nth-order vector adjustor;

a first determination step of determining whether or not an indicator indicating that a distortion component produced in the power amplifier has been canceled satisfies a predetermined condition and, if the indicator satisfies the condition, terminating the sequence of the vector adjuster coefficient deriving step and the vector adjuster setting step;

a first repetition control step of, if it is determined at the first determination step that the indicator does not satisfy the condition, determining whether or not the sequence of the vector adjuster coefficient deriving step and the vector adjuster setting step has been repeated a predetermined number of times and, if not, performing control to cause the sequence of the vector adjuster coefficient deriving step and the vector adjuster setting step to be repeated;
a frequency band specifying step of, if it is determined at the first repetition control step that the sequence has been repeated predetermined number of times, specifying a sub-band for which an Nth-order frequency characteristic compensator coefficient is to be calculated;
a frequency characteristic compensator coefficient deriving step of deriving a plurality of phase values and a plurality of amplitude values used for measuring a distortion component in the sub-band contained in an output of the power amplifier from previously found dependence of the distortion component on a phase value and on an amplitude value set in the Nth-order frequency characteristic compensator;
a frequency characteristic compensator setting step of setting in the Nth-order frequency characteristic compensator the plurality of phase values and the plurality of amplitude values derived in the frequency characteristic compensator coefficient deriving step, newly finding dependence of a distortion component in the sub--band contained in an output of the power amplifier on a phase value and on an amplitude value set in the Nth-order frequency characteristic compensator from a plurality of distortion component measurements obtained by the monitor under each of the plurality of set phase values and from a plurality of distortion component measurements obtained by the monitor under each of the plurality of set amplitude values, calculating a phase value and an amplitude value that cancel the distortion component in the sub-band contained in the output of the power amplifier from the newly found dependencies, and setting the calculated phase value and amplitude value in the Nth-order frequency characteristic compensator;
a second determination step of determining whether or not an indicator indicating that a distortion component produced in the power amplifier has been canceled satisfies a predetermined condition and, if the indicator satisfies the condition, terminating the sequence of the frequency band specifying step and the frequency characteristic compensator coefficient deriving step and the frequency characteristic compensator setting step;
a second repetition control step of, if it is determined at the second determination step that the indicator does not satisfy the condition, determining whether or not phase values and amplitude values to be set in the Nth-order frequency characteristic compensator have been calculated for all sub-bands, and if not, performing control to cause the sequence of the frequency band specifying step and the frequency characteristic compensator coefficient deriving step and the frequency characteristic compensator setting step to be repeated.

5. The distortion compensation control method for a power series digital predistorter according to claim 3 or 4, wherein:
dependence of a distortion component contained in an output of the power amplifier on a phase value set in the Nth-order vector adjuster has been previously found as coefficients "$a_2, a_1, a_0$" of a quadratic function $D=a_2X^2+a_1X+a_0$, where D being the distortion component and X being the phase value set in the Nth-order vector adjuster, and dependence of the distortion component on an amplitude value set in the Nth-order vector adjuster has been previously found as coefficients "$b_2, b_1, b_0$" of a quadratic function $D=b_2Y^2+b_1Y+b_0$, where D being the distortion component and Y being the amplitude value set in the Nth-order vector adjuster; and
the vector adjuster coefficient deriving step comprises:
a first phase value deriving sub-step of using the coefficients "$a_2, a_1, a_0$" of the quadratic function and a predetermined offset value $P_{vec,phase}$ to derive three or more phase values used for measuring the distortion component; and
a first amplitude value deriving sub-step of using the coefficients "$b_2, b_1, b_0$" of the quadratic function and a predetermined offset value $P_{vec,amp}$ to derive three or more amplitude values used for measuring the distortion component.

6. The distortion compensation control method for a power series digital predistorter according to claim 3 or 4, wherein:
dependence of a distortion component contained in an output of the power amplifier on a phase value set in the Nth-order vector adjuster has been previously found as coefficients "$a_2, a_1, a_0$" of a quadratic function $D=a_2X^2+a_1X+a_0$, where D being the distortion component and X being the phase value set in the Nth-order vector adjuster, and dependence of the distortion component on an amplitude value set in the Nth-order vector adjuster has been previously found as coefficients "$b_2, b_1, b_0$" of a quadratic function $D=b_2Y^2+b_1Y+b_0$, where D being the distortion component and Y being the amplitude value set in the Nth-order vector adjuster; and
the vector adjuster coefficient deriving step comprises:
a second phase value deriving sub-step of referring to a preset lookup table to retrieve a plurality of offset values associated with the previously found coefficient $a_2$ and using the coefficients "$a_2, a_1, a_0$" and the plurality of retrieved offset values to derive three or more phase values used for measuring the distortion component, the lookup table containing a plurality of offset values associated with values of the coefficient $a_2$; and
a second amplitude value deriving sub-step of referring to a preset lookup table to retrieve a plurality of offset values associated with the previously found coefficient $b_2$ and using the coefficients "$b_2, b_1, b_0$" and the plurality of retrieved offset values to derive three or more amplitude values used for measuring the distortion component, the lookup table containing a plurality of offset values associated with values of the coefficient $b_2$.

7. The distortion compensation control method for a power series digital predistorter according to claim 4, wherein:
dependence of a distortion component in the sub-band contained in an output of the power amplifier on a phase value set in the Nth-order frequency characteristic compensator has been previously found as coefficients "$a_{2,m}, a_{1,m}, a_{0,m}$" of a quadratic function $D_m=a_{2,m}X_m^2+a_{1,m}X_m+a_{0,m}$, where $D_m$ being the distortion component in the sub-band and $X_m$ being the phase value set in the Nth-order frequency characteristic compensator for adjusting a phase of the sub-band, and dependence of the distortion component on an amplitude value set in the Nth-order frequency characteristic compensator has been previously found as coefficients "$b_{2,m}, b_{1,m}, b_{0,m}$" of a quadratic function $D_m=b_{2,m}Y_m^2+b_{1,m}Y_m+b_{0,m}$, where $D_m$ being the distortion component in the sub-band and $Y_m$ being the amplitude value set in the Nth-order frequency characteristic compensator for adjusting an amplitude of the sub-band; and
the frequency characteristic compensator coefficient deriving step comprises:
a third phase value deriving sub-step of using the coefficients "$a_{2,m}, a_{1,m}, a_{0,m}$" of the quadratic function and a predetermined offset value $P_{m,phase}$ to derive three or more phase values used for measuring a distortion component in the sub-band; and a third amplitude value deriving sub-step of using the coefficients "$b_{2,m}$, $b_{1,m}$, $b_{0,m}$" of the quadratic function and a predetermined offset value $P_{m,amp}$ to derive three or more amplitude values used for measuring the distortion component in the sub-band.

8. The distortion compensation control method for a power series digital predistorter according to claim 4, wherein:

dependence of a distortion component in the sub-band contained in an output of the power amplifier on a phase value set in the Nth-order frequency characteristic compensator has been previously found as coefficients "$a_{2,m}$, $a_{1,m}$, $a_{0,m}$" of a quadratic function $D_m = a_{2,m} X_m^2 + a_{1,m} X_m + a_{0,m}$, where $D_m$ being the distortion component in the sub-band and $X_m$ being the phase value set in the Nth-order frequency characteristic compensator for adjusting a phase of the sub-band, and dependence of the distortion component on an amplitude value set in the Nth-order frequency characteristic compensator has been previously found as coefficients "$b_{2,m}$, $b_{1,m}$, $b_{0,m}$" of a quadratic function $D_m = b_{2,m} Y_m^2 + b_{1,m} Y_m + b_{0,m}$, where $D_m$ being the distortion component in the sub-band and $Y_m$ being the amplitude value set in the Nth-order frequency characteristic compensator for adjusting an amplitude of the sub-band; and the frequency characteristic compensator coefficient deriving step comprises:

a fourth phase value deriving sub-step of referring to a preset lookup table to retrieve a plurality of offset values associated with the previously found coefficient $a_{2,m}$ and using the coefficients "$a_{2,m}$, $a_{1,m}$, $a_{0,m}$" and the plurality of retrieved offset values to derive three or more phase values used for measuring the distortion component in the sub-band, the lookup table containing a plurality of offset values associated with values of the coefficient $a_{2,m}$; and a fourth amplitude value deriving sub-step of referring to a preset lookup table to retrieve a plurality of offset values associated with the previously found coefficients $b_{2,m}$, and using the coefficients "$b_{2,m}$, $b_{1,m}$, $b_{0,m}$" and the plurality of retrieved offset values to derive three or more amplitude values used for measuring the distortion component in the sub-band, the lookup table containing a plurality of offset values associated with values of the coefficient $b_{2,m}$.

* * * * *